(12) United States Patent
Lu et al.

(10) Patent No.: US 11,114,378 B2
(45) Date of Patent: *Sep. 7, 2021

(54) SEMICONDUCTOR STRUCTURE WITH ULTRA THICK METAL AND MANUFACTURING METHOD THEREOF

(71) Applicant: TAIWAN SEMICONDUCTOR MANUFACTURING COMPANY LTD., Hsinchu (TW)

(72) Inventors: Chen-Fa Lu, Kaohsiung (TW); Cheng-Yuan Tsai, Hsin-Chu County (TW); Ching-Chung Hsu, Taichung (TW); Chung-Long Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 52 days.

This patent is subject to a terminal disclaimer.

(21) Appl. No.: 16/389,500

(22) Filed: Apr. 19, 2019

(65) Prior Publication Data
US 2019/0252317 A1  Aug. 15, 2019

Related U.S. Application Data

(63) Continuation of application No. 14/874,147, filed on Oct. 2, 2015, now Pat. No. 10,269,701.

(51) Int. Cl.
*H01L 29/00* (2006.01)
*H01L 23/522* (2006.01)
(Continued)

(52) U.S. Cl.
CPC ...... *H01L 23/5227* (2013.01); *H01L 21/0273* (2013.01); *H01L 21/288* (2013.01);
(Continued)

(58) Field of Classification Search
CPC .......... H01L 2924/00; H01L 21/76802; H01L 29/4236; H01L 23/5227; H01L 23/481; H01L 23/48; H01L 23/49822; H01L 23/5226; H01L 23/528; H01L 23/5389; H01L 23/5283; H01L 23/5329; H01L 23/3171
(Continued)

(56) References Cited

U.S. PATENT DOCUMENTS

| 10,269,701 B2 * | 4/2019 | Lu ........................ H01L 21/288 |
| 2006/0022787 A1 * | 2/2006 | Brennan ............... H01F 41/046 336/200 |
| 2014/0008814 A1 * | 1/2014 | Chen ...................... H01L 21/48 257/774 |

* cited by examiner

*Primary Examiner* — Theresa T Doan
(74) *Attorney, Agent, or Firm* — WPAT, P.C.; Anthony King

(57) ABSTRACT

The present disclosure provides a semiconductor structure having an ultra thick metal (UTM). The semiconductor structure includes a substrate, a metal layer over the substrate, and an UTM over the metal layer. An area density of the UTM is greater than 40% and a thickness of the UTM is equal to or greater than 6 micrometer. The present disclosure provides a method for manufacturing a semiconductor structure having a UTM. The method includes patterning a dielectric layer with a plurality of trenches by a first mask, patterning a photoresist positioning on a mesa between adjacent trenches by a second mask, and selectively plating conductive materials in the plurality of trenches.

20 Claims, 20 Drawing Sheets

(51) Int. Cl.
*H01L 23/532* (2006.01)
*H01L 21/027* (2006.01)
*H01L 21/288* (2006.01)
*H01L 21/311* (2006.01)
*H01L 21/768* (2006.01)
*H01L 23/31* (2006.01)
*H01L 23/528* (2006.01)

(52) U.S. Cl.
CPC .... *H01L 21/31144* (2013.01); *H01L 21/7684* (2013.01); *H01L 21/76802* (2013.01); *H01L 21/76879* (2013.01); *H01L 23/3171* (2013.01); *H01L 23/5226* (2013.01); *H01L 23/5283* (2013.01); *H01L 23/5329* (2013.01); *H01L 23/53238* (2013.01); *H01L 23/53295* (2013.01); *H01L 2224/11* (2013.01)

(58) Field of Classification Search
USPC .......................................................... 257/531
See application file for complete search history.

SEMICONDUCTOR STRUCTURE WITH ULTRA THICK METAL AND MANUFACTURING METHOD THEREOF

CROSS REFERENCE TO RELATED APPLICATIONS

This application is a continuation application of prior-filed application Ser. No. 14/874,147, filed Oct. 2, 2015, and claims the benefit under 35 U.S.C. 120 thereto.

FIELD

The present disclosure relates to a semiconductor structure having ultra thick metal (UTM) and method of manufacturing the semiconductor structure having UTM.

BACKGROUND

The semiconductor integrated circuit (IC) industry has produced a wide variety of devices to address issues in a number of different areas, including radio frequency (RF) communications. While growing in popularity, improving RF integrated circuits puts particular demands on the semiconductor process. Some RF circuits employ thick metal layers, even ultra-thick metal layers (UTM) for inductive and other properties. However, some traditional semiconductor processing techniques do not readily scale for use with UTM.

In some instances, semiconductor integrated circuit (IC) devices, such as radio frequency (RF) IC devices, include stacked metal layers. Some RF ICs employ both metal layers and ultra thick metal (UTM) layers in which the UTM layers have a greater thickness than the metal layers. For example, while some metal layers range from about 1,000 to about 8,000 Å in thickness, some UTM layers range from about 8,500 Å to about 38,000 Å in thickness. In some RF ICs, one or more UTM layers are formed over the metal layers separated by insulating layers except where portions of the metal and UTM layers are connected by one or more vias.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
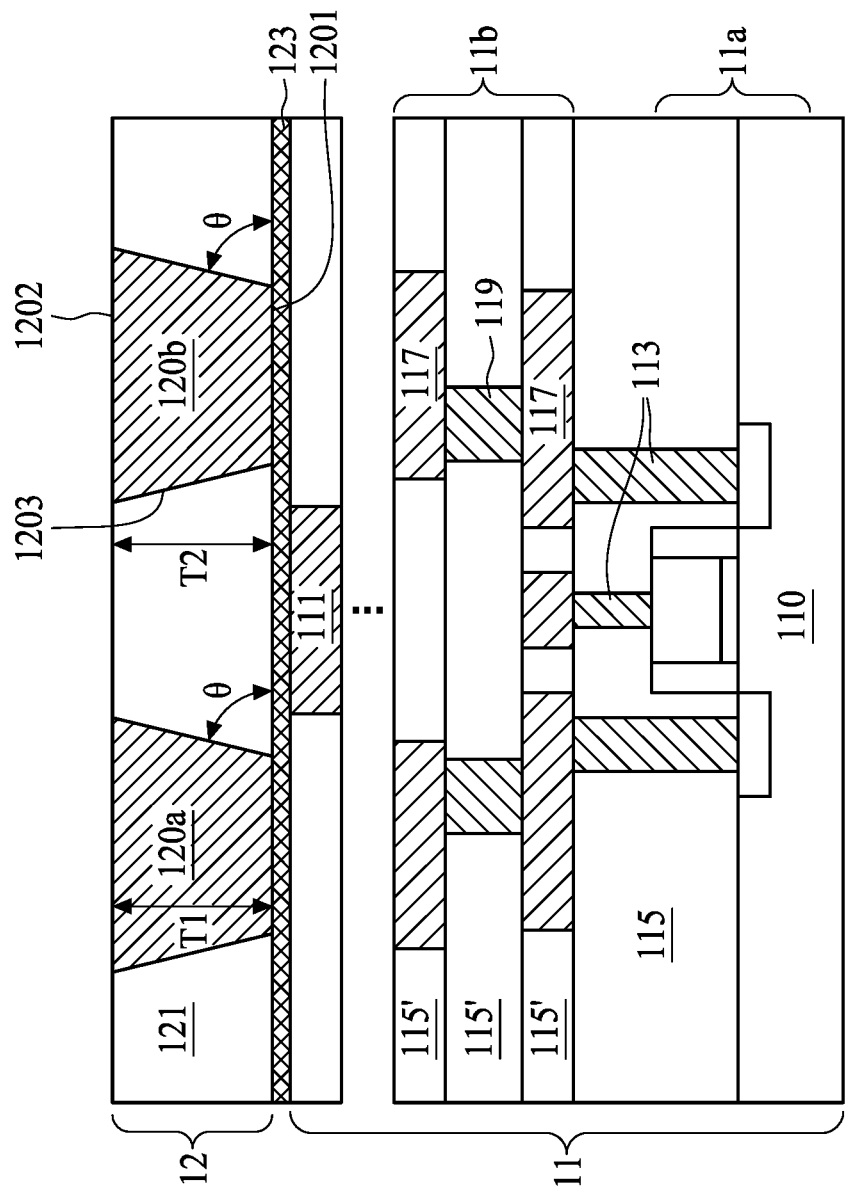
FIG. 1 is a cross sectional view of a semiconductor structure having an ultra thick metal (UTM), according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Because of the lack of volatile copper compounds, copper could not be patterned by the previous techniques of photoresist masking and plasma etching that had been used with great success with aluminum. The inability to plasma etch copper called for a drastic rethinking of the metal patterning process and the result of this rethinking was a process referred to as an additive patterning, also known as a "Damascene" or "dual-Damascene" process by analogy to a traditional technique of metal inlaying. In this process, the underlying dielectric layer is patterned with open trenches where the conductor should be. A thick coating of copper that significantly overfills the trenches is deposited on the insulator, and chemical-mechanical planarization (CMP) is used to remove the copper (known as overburden) that extends above the top of the insulating layer. Copper sunken within the trenches of the insulating layer is not removed and becomes the patterned conductor.

In the present disclosure, by the term Damascene is meant any damascene interconnect structure e.g., both single and dual damascenes, including vias, contact openings, and trench lines. Further, the term "copper" will be understood to include copper and alloys thereof.

Due to the fact that depositing copper in the open trenches exerts tensile stress to the underlying wafer as a whole, a thickness of the copper layer is thus limited to an amount that may not seriously contribute to wafer warpage. For example, a 3 µm-thick copper prepared under Damascene scheme may contribute to about 600 µm of warpage on a 12 inch wafer. Under the circumstances where an ultra thick metal (UTM) is required so as to, for example, reduce metal resistance in a back-end metallization operation, depositing UTM copper is problematic. To elaborate, if a 10 µm-thick copper is required to meet device specification, three repetitive 3 µm-thick copper depositions can be applied, resulting in serious wafer warpage over 2000 µm. New structure and method for depositing UTM copper over 3 µm under Damascene scheme is thus in need.

Throughout the description, the term "UTM" refers to the collection of all UTM lines in dielectric. In some embodiments, UTM forms a portion of an inductor. In other embodiments, UTM forms a portion of a capacitor. Still in other embodiments, UTM forms a portion of a power line. In the present disclosure, UTM can be applied either in a top metal layer of a transistor structure or a layer over the aforesaid top metal layer. The former can be categorized as a front-end operation, whereas the latter can be categorized as a back-end operation. However, the front-end or back-end operations are not designated as a distinguishable operation to prepare the aforesaid top metal or the layer over the top metal.

For example, an inductor over the top metal of a transistor structure may include an upper metal, a lower metal, and a via connecting the upper metal and the lower metal to form a conductive loop. In some embodiments, the upper metal can be post-passivation interconnect (PPI) and the lower metal can be a UTM. Conventionally the UTM possesses a thickness of about or less than 3 µm concerning wafer warpage. The 3 µm-thick UTM becomes a bottle neck for reducing the series resistance composed of the upper metal, the via, and the lower metal. In other words, if a thickness of the lower metal can be doubled or tripled, the overall series resistance of the inductor conductive loop can be effectively decreased.

The present disclosure provides a UTM and a method of manufacturing such UTM in order to achieve a UTM thickness greater than 3 µm. For example, a 6 µm-thick or a 10-µm thick UTM without scaled-up wafer warpage can be prepared according to the method and the structure proposed herein.

Referring to FIG. 1, FIG. 1 is a cross sectional view of a semiconductor structure 10 having an ultra thick metal (UTM), according to some embodiments of the present disclosure. In some embodiments, the semiconductor structure 10 includes a logic substrate 11 and metal structure 12 above the logic substrate. The logic substrate 11 herein is referred to a transistor structure formed at a front side of a semiconductor substrate. For example, the transistor structure may include a transistor and several layers of metal lines communicating between each transistor. In some embodiments, the logic substrate 11 includes a transistor as at the bottom and a top metal layer at the top. The logic substrate 11 can be formed by one or more than one of a front-end-of-line (FEOL), a middle-end-of-line (MEOL), and a back-end-of-line (BEOL) operation.

In an embodiment, substrate 110 is a semiconductor substrate, such as a silicon substrate, although it may include other semiconductor materials, such as silicon germanium, silicon carbide, gallium arsenide, or the like. In the present embodiment, the substrate 110 is a p-type semiconductor substrate (P-Substrate) or an n-type semiconductor substrate (N-Substrate) comprising silicon. Alternatively, the substrate 110 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor on insulator (SOI). In other alternatives, semiconductor substrate 110 may include a doped epi layer, a gradient semiconductor layer, and/or a semiconductor layer overlying another semiconductor layer of a different type, such as a silicon layer on a silicon germanium layer. The substrate 110 may or may not include doped regions, such as a p-well, an n-well, or combination thereof.

Semiconductor devices 11a, which are symbolized using a transistor, may be formed at a surface of substrate 110. In alternative embodiments, substrate 110 is a dielectric substrate, and no active devices are formed on the dielectric substrate, although passive devices such as capacitors, inductors, resistors, and the like may be formed. Contact plugs 113 are formed in inter-layer dielectric (ILD) 115, and may be electrically coupled to semiconductor devices 11a.

Interconnect structure 11b, which includes metal lines 117 and vias 119 therein and electrically coupled to semiconductor devices 11a, is formed over ILD 115. Metal lines 117 and vias 119 may be formed of substantially pure copper (for example, with a weight percentage of copper being greater than about 90 percent, or greater than about 95 percent) or copper alloys, and may be formed using the single and/or dual damascene processes. Metal lines 117 and vias 119 may be, or may not be, substantially free from aluminum. Interconnect structure 11b includes a plurality of metal layers, namely M1, M2 . . . Mtop 111, wherein metal layer M1 is the metal layer immediately above ILD 115, while metal layer Mtop 111 is the top metal layer that is immediately under the overlying UTM 120a and 120b, which are formed in subsequent steps. Throughout the description, the term "metal layer" refers to the collection of the metal lines in the same layer. Metal layers M1 through Mtop 111 are formed in inter-metal dielectrics (IMDs) 115', which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 115' may also be close to 3.8. In some embodiments, the k values of the low-k dielectric materials are lower than about 3.0, and may be lower than about 2.5.

In the following discussed embodiments, the top metal layer Mtop 111 may be metal layer M5, although in other embodiments, a metal layer higher than or lower than M5 may be the Mtop 111. Furthermore, in exemplary embodiments, metal layer M1 may have a thickness between about 2.0 kÅ and about 3.5 kÅ, and metal layers M2 through Mtop 111 may have thicknesses between about 3.0 kÅ. And about 4.0 kÅ. It is realized, however, that the dimensions recited throughout the description are merely examples, and may be changed in alternative embodiments.

In FIG. 1, an UTM layer 12 including UTM 120a and 120b is positioned over the Mtop 111, possessing a thickness T1 equal to or greater than 6 µm, for example. The UTM may include copper. In some embodiments, the UTM includes aluminum, gold, silver and known alloys, some of which include copper. UTM 120*a* and 120*b* is surrounded by dielectric 121. In some embodiments, the dielectric 121 may be similar material as that of the IMDs 115' and having a thickness T2 substantially identical to the thickness T1 of the UTM 120*a*, 120*b*. An isolation layer 123 is disposed at the interface of the UTM 120*a*, 120*b* and the Mtop 111, preventing physical contact between the UTM material with the IMDs 115'. To elaborate, the isolation layer 123 is configured as a first etch stop layer including silicon nitride (SiN) and silicon carbide (SiC). In some embodiments, the first etch stop layer includes SiN, SiC, silicon oxynitride (SiON), fluoride-doped silicate glass (FSG), a low dielectric constant (low-K) dielectric material, other suitable materials, and/or combinations thereof. In some embodiments, the first etch stop layer includes a tensile etch stop layer and/or a compressive etch stop layer. In some embodiments, the first etch stop layer is formed by converting an upper portion of a buffer layer into the etch stop layer. For example, carbon atoms are implanted onto the buffer layer by performing ion implantation or plasma assisted implantation. In some embodiments, the etch stop layer is deposited or grown on the buffer layer by performing atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof. In yet some other embodiments, the first etch stop layer is deposited or grown over the buffer layer or, if the buffer layer is omitted, over the metal layer and the substrate.

Figure 2:
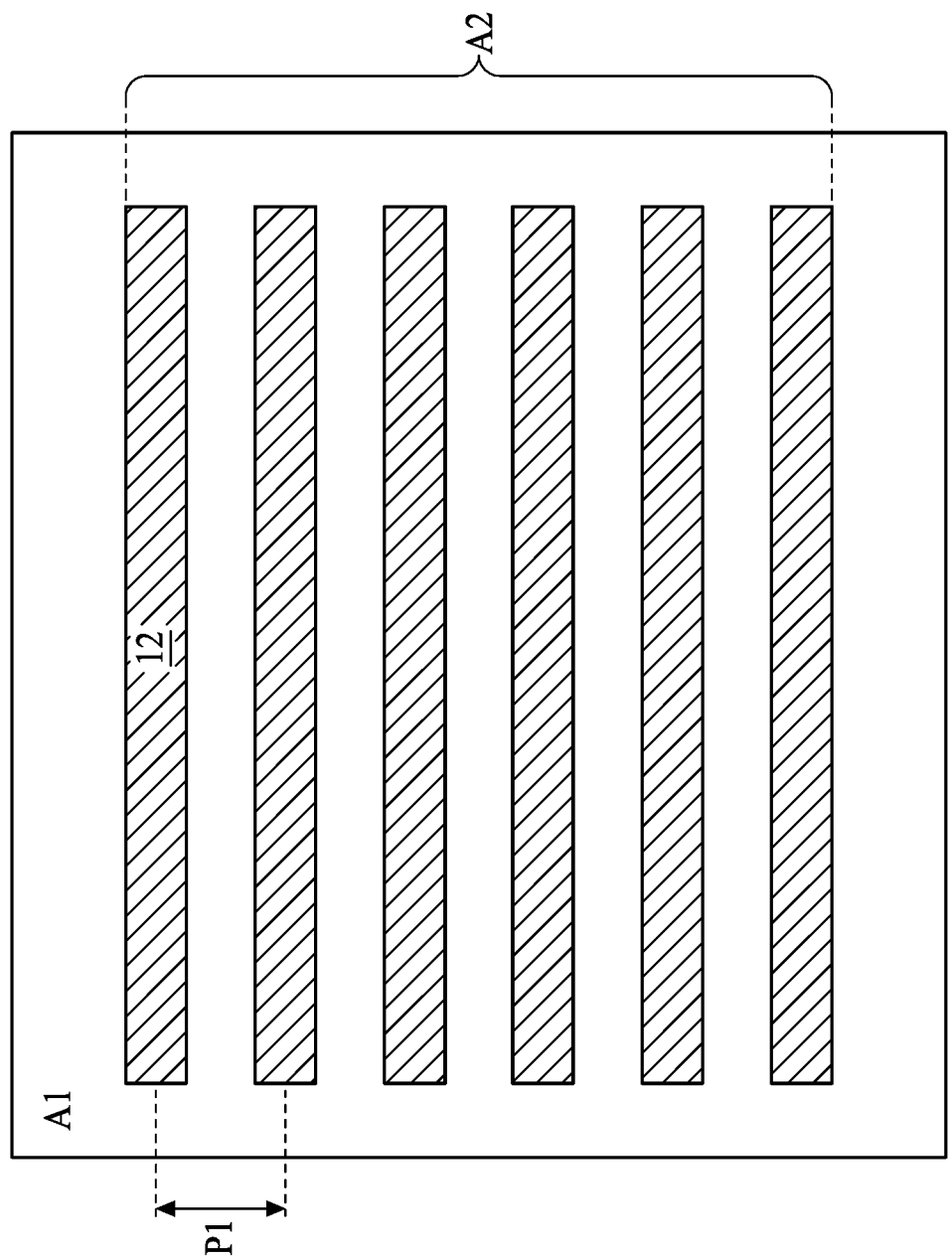
FIG. 2 is a top view of a semiconductor structure having a UTM, according to some embodiments of the present disclosure.

Referring to FIG. 2, FIG. 2 is a top view of a semiconductor structure having a UTM, according to some embodiments of the present disclosure. FIG. 2 is a top view of the semiconductor structure 10 shown in FIG. 1. In some embodiments, the UTM 120*a*, 120*b* is possesses a line feature with a pitch P1 of from about 20 μm to about 375 μm. The term "critical dimension" of a line pitch referred herein is directed to the pitch P1, as illustrated in FIG. 2. The critical dimension represents a minimal dimension that could be found in a pattern. An UTM may possess multiple sets of different line pitch, among which the minimal line pitch can be referred to the critical dimension of a line pitch. In some embodiments, the UTM 120*a*, 120*b* possesses a pitch P1 of 30 μm as a portion of an inductor. Detailed description of the inductor will be discussed later in the present disclosure. In some embodiments, a critical dimension of the width of each UTM line can be about 10 μm. Similarly, a critical dimension of a separation between adjacent UTM lines can be about 10 μm.

In FIG. 2, the line feature of the UTM possesses an area A2, whereas the total area of the substrate 110 possesses an area A1. Note the total area of the substrate 110 can be a total area of an individual die containing the UTM structure disclosed herein. In some embodiments, an area ratio (A2/A1) is more than 40%. The area ratio (A2/A1) can be referred to an area density of the UTM. The area density of the UTM is a collective concept of the total UTM area to the total substrate area specifically at the UTM layer 12. When the area density of the UTM is greater than 40%, wafer warpage becomes more severe because the greater tensile stress generated between the heterointerface. It is thus more beneficial to adopt the structure and method of preparing the structure disclosed herein when the area density of the UTM is greater than 40%.

Referring back to FIG. 1, the UTM 120*a*, 120*b* possesses a trapezoidal shape having a shorter side 1201 in proximity to the Mtop 111 or the isolation layer 123 and a longer side 1202 opposite to the shorter side 1201. In some embodiments, an acute angle θ measured between a sidewall 1203 of the trapezoidal UTM and an extension of the shorter side 1201 is in a range of from about 40 degrees to about 60 degrees. In other embodiments, the acute angle θ is in a range of from about 50 degrees to about 70 degrees. When comparing to UTM prepared by conventional Damascene operation, the aforesaid angle θ is generally greater than 80 degrees. A more acute angle θ is beneficial to the subsequent barrier and/or seed layer deposition, and ultimately the gap fill operation. The barrier and/or seed layer can be formed with better conformity and better uniformity on a milder slope (i.e., a more acute angle θ).

Figure 3:
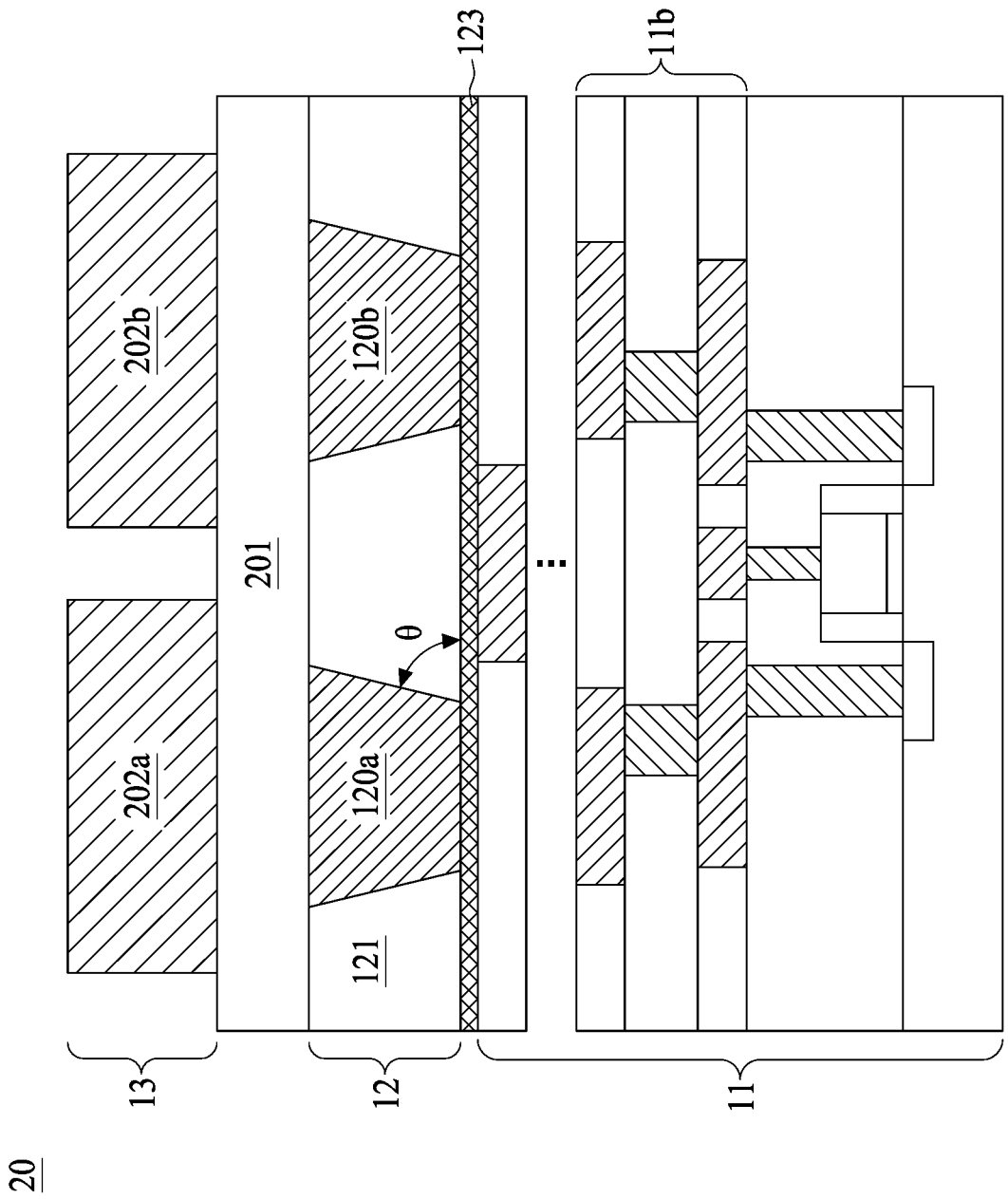
FIG. 3 is a semiconductor structure having a UTM, according to some embodiments of the present disclosure.

Referring to FIG. 3, FIG. 3 is a semiconductor structure 20 having a UTM, according to some embodiments of the present disclosure. The semiconductor structure 20 is similar to the semiconductor structure 10 with an additional feature of a passivation 201 and a post-passivation interconnect (PPI) 202*a*, 202*b*. In some embodiments, a collection of PPI 202*a*, 202*b* can be referred to as an upper metal 13, whereas the UTM layer 12 can be referred to as lower metal herein. In an embodiment, passivation 201 is formed of silicon oxide and silicon nitride over silicon oxide (not shown in FIG. 3). The bottom surface of passivation 201, which may be the bottom surface of silicon oxide, may contact UTM 120*a*, 120*b*. Passivation 201 may be formed of polyimide, silicon oxide, silicon nitride, and/or the like. Passivation 201 may have an opening, through which a metal pad (not shown in FIG. 3) is exposed to receive under-bump metallurgy (UBM) extending into the opening of the passivation 201. Furthermore, metal bump, which may be a solder bump or a bump comprising copper, nickel, palladium, and/or the like, is formed on the UBM.

In some embodiments, a barrier layer (not shown in FIG. 3) is formed over the passivation 201. The barrier layer may include a nitride or an oxynitride, such as titanium nitride, titanium oxynitride, tantalum nitride, tantalum oxynitride, tungsten nitride, silicon dioxide, the like, or a combination thereof. The PPI 202*a*, 202*b* may be formed over the barrier layer using methods such as an electro-chemical plating process, CVD, ALD, physical vapor deposition (PVD), the like, or a combination thereof. The pattern of the PPI 202*a*, 202*b*, such as parallel line shape, can be further patterned through photolithography operations. In some embodiment, the PPI 202*a*, 202*b* may include copper, tungsten, aluminum, silver, gold, the like, or a combination thereof.

Referring to FIG. 3, a capacitor structure is formed between the PPI 202*a*, 202*b*, the passivation 201, and the UTM 120*a*, 120*b*. A Metal-Insulator-Metal (MIM) capacitors have been widely used in functional circuits such as mixed-signal circuits, analog circuits, radio frequency (RF) circuits, dynamic random access memories (DRAMs), embedded DRAMs, and logic operation circuits. Conventional MIM capacitors were formed in interconnect structure 11*b*. Since the interconnect structures 11*b* include copper lines 117 and copper vias 119 formed of Damascene operations, the formation of conventional MIM capacitors was integrated with the Damascene processes. For example, a bottom electrode of a MIM capacitor may be formed in one of the metal layers in the interconnect structure, while the top electrode of the MIM capacitor may be formed between two metal layers. Conventional MIM capacitors are formed at the same level as the via 119 connecting overlying and underlying metal lines 117. As a result, no metal line can be routed in the metal layer immediately under the MIM capacitors and in the regions vertically overlapping the MIM capacitors. The UTM and the PPI disclosed herein may form a bottom and a top electrode of a MIM capacitor with the passivation 201 being the capacitor dielectric. The thickness of the passivation 201 can be adjusted to fit the device specification. The MIM capacitor as shown in FIG. 3 is above the interconnect structure 11b and thus not occupying the routing area in the interconnect structure 11b.

Figure 4:
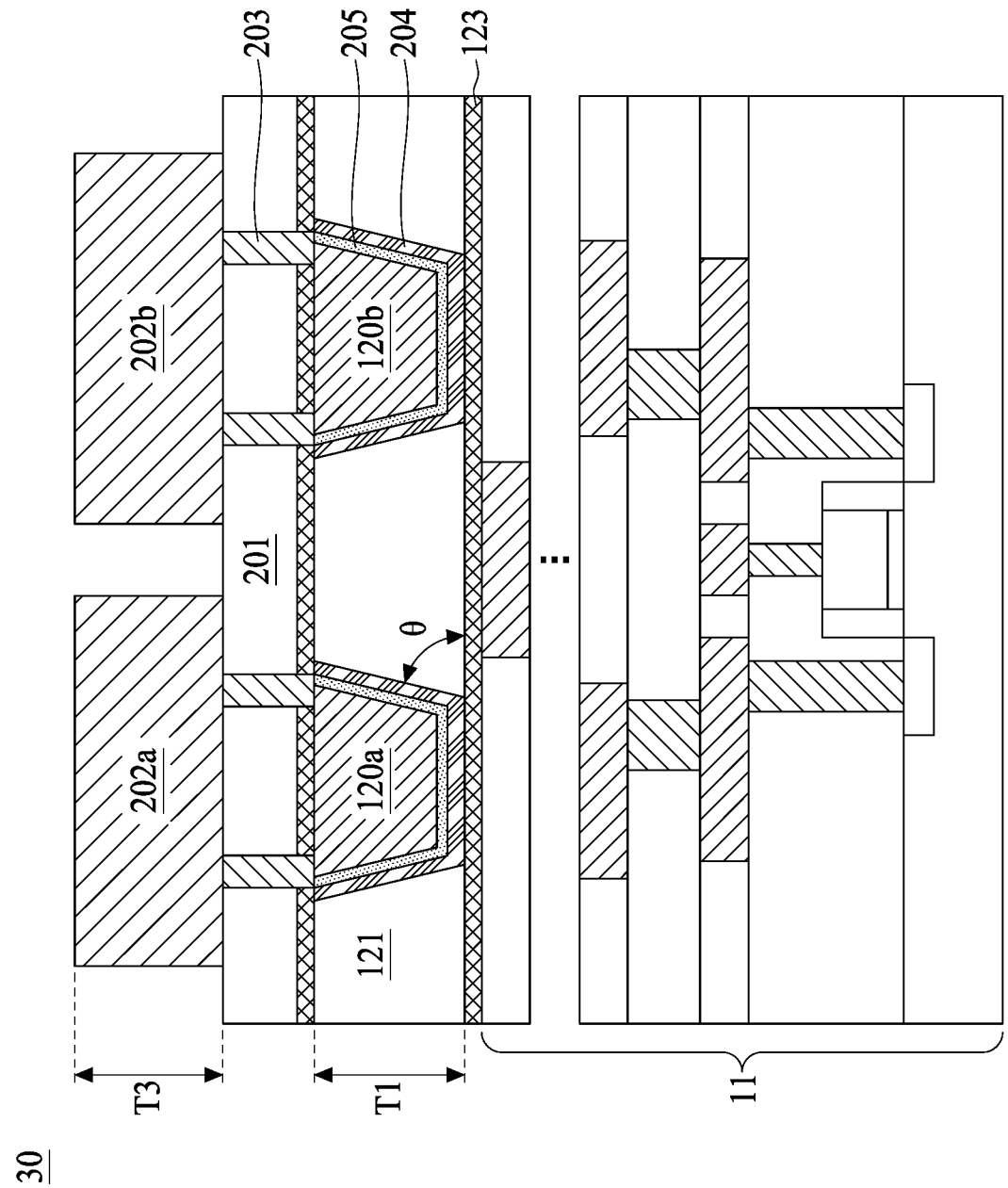
FIG. 4 is a semiconductor structure having an inductor, according to some embodiments of the present disclosure.
Figure 19:
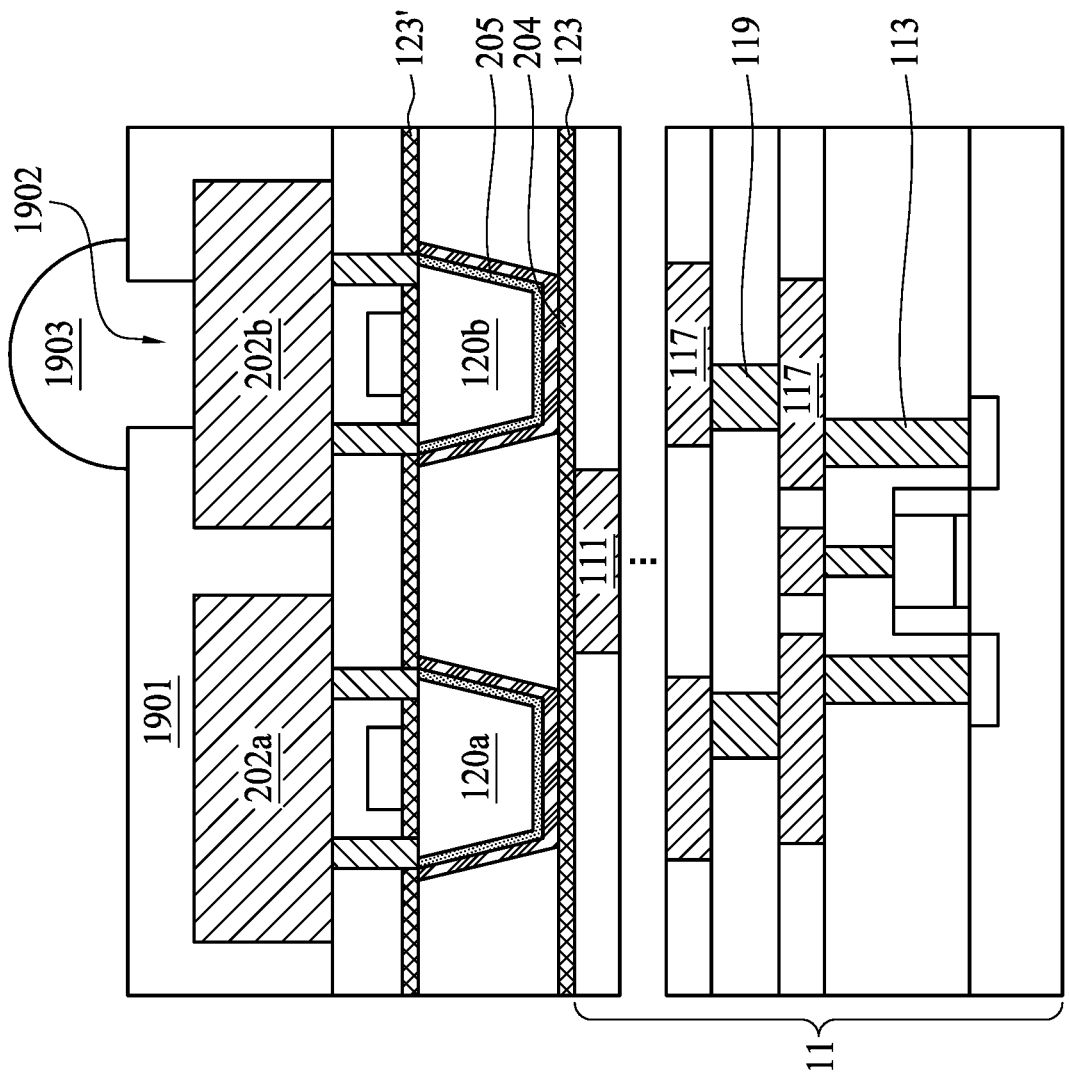

Referring to FIG. 4, FIG. 4 is a semiconductor structure 30 having an inductor, according to some embodiments of the present disclosure. The semiconductor structure 30 is similar to the semiconductor structure 20 with an additional feature of a via 203 connecting the PPI 202a, 202b and the UTM 120a, 120b, a barrier layer 204 between the trapezoidal UTM 120a, 120b and the dielectric 121 surrounding the UTM, and a seed layer 205 overlaying the barrier layer 204. In some embodiments, a thickness T3 of the PPI 202a, 202b is equal to or greater than 10 μm. In some embodiments, the semiconductor structure 30 includes a discrete inductor because the UTM 120a, 120b is isolated from the transistor structure 11 by the isolation 123. In other words, the inductor is not electrically coupled to the transistor structure 11 in FIG. 4. As shown in FIG. 19 and discussed in the related paragraphs, extra electrical connection is required to connect the inductor to the logic circuit through an external routing, such as a wire bond.

In some embodiments, the barrier layer 204 is configured as a diffusion barrier. A diffusion barrier can be blanket deposited to line Damascene opening in the dielectric 121, including overlying an exposed portion of conductive member at a bottom portion. The diffusion barrier prevents copper from diffusing into surrounding materials such as the isolation layer 123. In an exemplary embodiment, the diffusion barrier is deposited by one of a CVD, PVD, ion metal plasma (IMP), or self-ionized plasma (SIP). In an exemplary embodiment, the diffusion barrier includes silicon nitride. In some embodiments, the diffusion barrier includes at least one layer of SiON, Ta, TaN, Ti, TiN, WN, Cr, CrN, TaSiN, TiSiN, and WSiN. In some other embodiments, the diffusion barrier is Ta/TaN, TaN or TaSiN, or a dual layer of TaN. In some embodiments, the SiON barrier layer possesses a thickness of from about 1 kÅ to about 3 kÅ. It is understood that the dimensions recited are merely examples, and will change with the down scaling of integrated circuits.

In some embodiments, the seed layer 205 is a metal such as copper (Cu), aluminum (Al), titanium (Ti), gold (Au), manganese (Mn), an alloy, or another material that accepts an electroplated layer. The seed layer 205 is formed by atomic layer deposition (ALD), plasma enhanced ALD (PEALD), CVD, PECVD or another process to a thickness between about 0.5 kÅ and about 2 kÅ.

Furthermore, in some embodiments, a protection layer (not shown in FIG. 4) can be optionally disposed over the seed layer 205. The protection layer is configured to protect the seed layer 402 from oxidation and contamination. The protection layer is formed by ALD, PEALD, CVD, PECVD or another deposition process to a thickness between about 1 Å and about 50 Å. In an embodiment, the seed layer 205 and the protection layer are formed in an inert environment to prevent oxidation of the seed layer prior to and during formation of the protection layer. For example, the seed layer 205 and protection layer are formed in a single CVD processing chamber in an argon (Ar) environment. The argon environment is maintained during formation of the seed layer 205 and through the formation of the protection layer. The argon displaces oxygen that would oxidize the seed layer 205, resulting in a seed layer 205 substantially free of oxidation after formation of the protection layer. The protection layer is formed from a material having a lower reduction-oxidation potential than the material to be plated. For example, in an embodiment where the seed layer 205 is copper, and the electroplating material is copper, the protection layer is Mn, cobalt (Co), Ti, Al, vanadium (V), chromium (Cr), zinc (Zn), zirconium (Zr), and alloys or oxides of the same.

Figure 5:
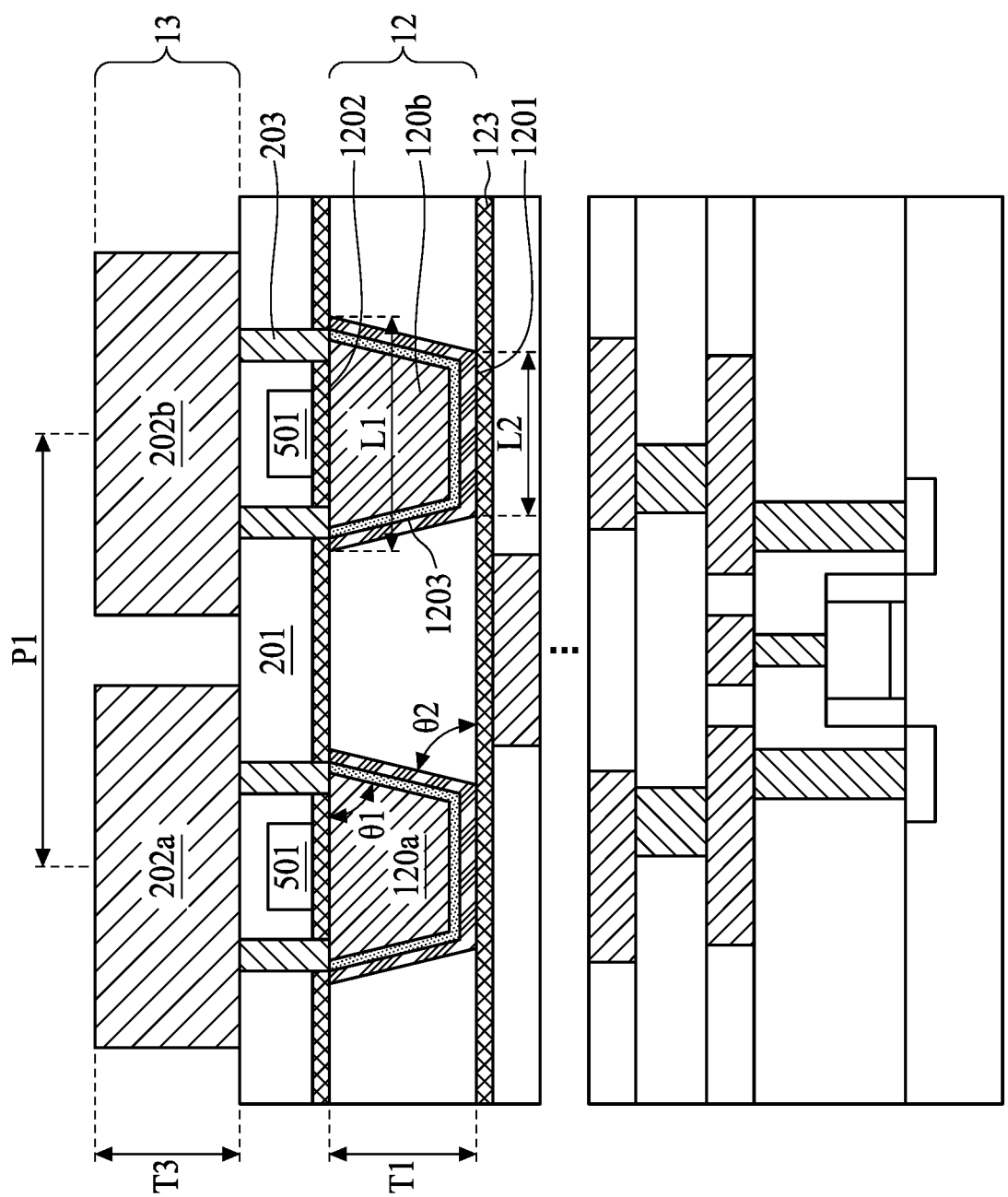
FIG. 5 is a semiconductor structure having an inductor, according to some embodiments of the present disclosure.

Referring to FIG. 5, FIG. 5 is a semiconductor structure 40 having an inductor, according to some embodiments of the present disclosure. The semiconductor structure 40 is similar to the semiconductor structure 30 with an additional feature of a magnetic core 501 between the PPI 202a, 202b and the UTM 120a, 120b. In some embodiments, the magnetic core 501 is laterally surrounded by the via 203 as illustrated in FIG. 4. In other words, the via 203 and the magnetic core 501 are in a passivation 201 below the PPI 202a, 202b.

In FIG. 5, the PPI 202a, 202b is an upper metal 13 or a top electrode of an inductor. In addition, the UTM 120a, 120b is a lower metal 12 or a bottom electrode of the inductor. Furthermore, the via 203 electrically connecting the upper metal 13 and the lower metal 12 together with the upper metal 13 and the lower metal 12 form a conductive loop spiraling down the magnetic core 501. In some embodiments, the magnetic core 501 can be a Cobalt Zirconium Tantalum (CoZrTa, or CZT), NiFe, the like, or the combinations thereof.

In some embodiments, the lower metal or the UTM 120a, 120b possesses a thickness of greater than 6 μm. In some embodiments, the upper metal or the PPI 202a, 202b possesses a thickness similar to or greater than that of the UTM 120a, 120b. For example, a thickness T3 of the upper metal is equal to or greater 10 μm, whereas a thickness T1 of the lower metal is about 6 μm or about 9 μm. Alternatively stated, the upper metal is thicker than the lower metal. In some embodiments, a pitch of adjacent line features and an area density of the UTM 120a, 120b in semiconductor structure 40 are similar to that disclosed previously in FIG. 2.

Still referring to FIG. 5, the lower metal 12 or the UTM 120a, 120b includes a line pattern. FIG. 5 shows a cross section of two lines. The cross section of the line pattern includes an upper surface 1202 and a lower surface 1201. The upper surface 1202 is closer to the via 203 compared to the lower surface 1201. The upper surface 1202, the lower surface 1201, and two sidewalls 1203 of the line pattern form a trapezoidal cross section of the line pattern. As shown in FIG. 5, an acute angle θ1 formed by the upper surface 1202 and sidewall 1203 is substantially identical to the acute angle θ2 formed by an extension of the lower surface 1201 and sidewall 1203. Alternatively stated, tan(θ) can be defined as a ratio of one half of a length difference between the upper surface 1202 and the lower surface 1201 (i.e., (L1−L2)/2) and the thickness T1 of the lower metal 120a, 120b. In some embodiments, the value of tan(θ) is in a range of from about 0.8 to about 2.8.

Optionally, a second isolation 123' (not shown in FIG. 5, please refer to FIG. 18) or a second etch stop layer can be formed over the upper surface 1202 of the UTM 120a, 120b. Similar to the first etch stop layer 123, the second etch stop layer includes SiN and SiC. In some embodiments, the second etch stop layer includes SiN, SiC, silicon oxynitride (SiON), fluoride-doped silicate glass (FSG), a low dielectric constant (low-K) dielectric material, other suitable materials, and/or combinations thereof. In some embodiments, the second etch stop layer is formed by performing ALD, CVD, wet oxidation, PVD, RPCVD, PECVD, MOCVD, sputtering, plating, other suitable processes, and/or combinations thereof. In some embodiments, the second etch stop layer includes a tensile etch stop layer and/or a compressive etch stop layer.

Figure 6:
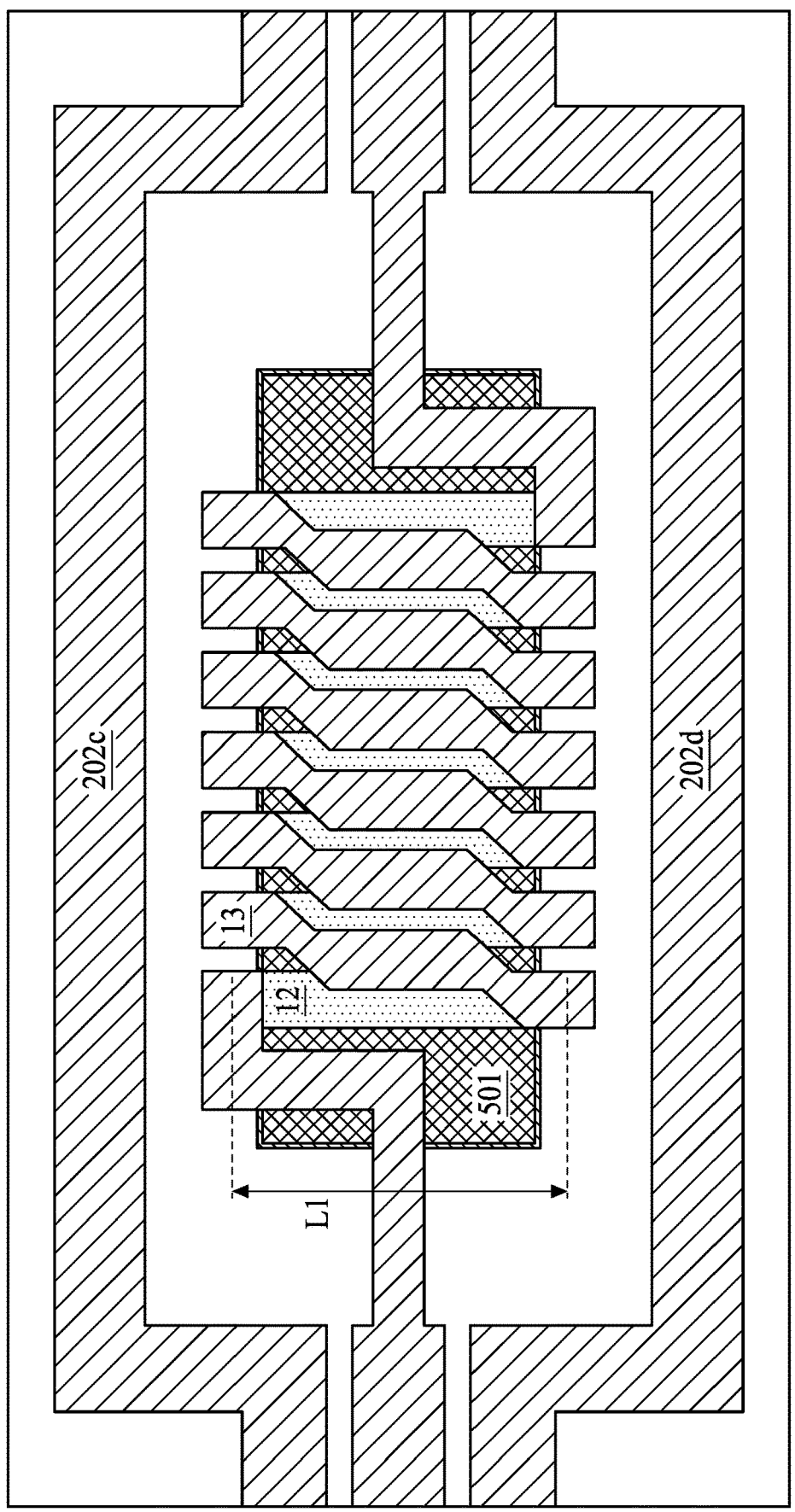
FIG. 6 is a top view of semiconductor structure having an inductor, according to some embodiments of the present disclosure.

Referring to FIG. 6, FIG. 6 is a top view of the semiconductor structure 40 having a magnetic inductor, according to some embodiments of the present disclosure. In FIG. 6, an upper metal 13 (or the PPI 202a, 202b) and a lower metal 12 (or the UTM 120a, 120b) can be observed from a top view perspective. The via 203 connecting the pattern of the upper metal 13 and the pattern of the lower metal 12 is covered by the upper metal 13 and is not shown in FIG. 6. A magnetic core 501 is positioned between the upper metal 13 and the lower metal 12. In some embodiments, other patterns 202c, 202d on the same level with the upper metal 13 can be designed in addition to the upper electrode of the inductor. Similarly, other patterns (not shown in FIG. 6 for clarity) on the same level with the lower metal 12 can be designed in addition to the line pattern for the lower electrode of the inductor.

Figure 7:
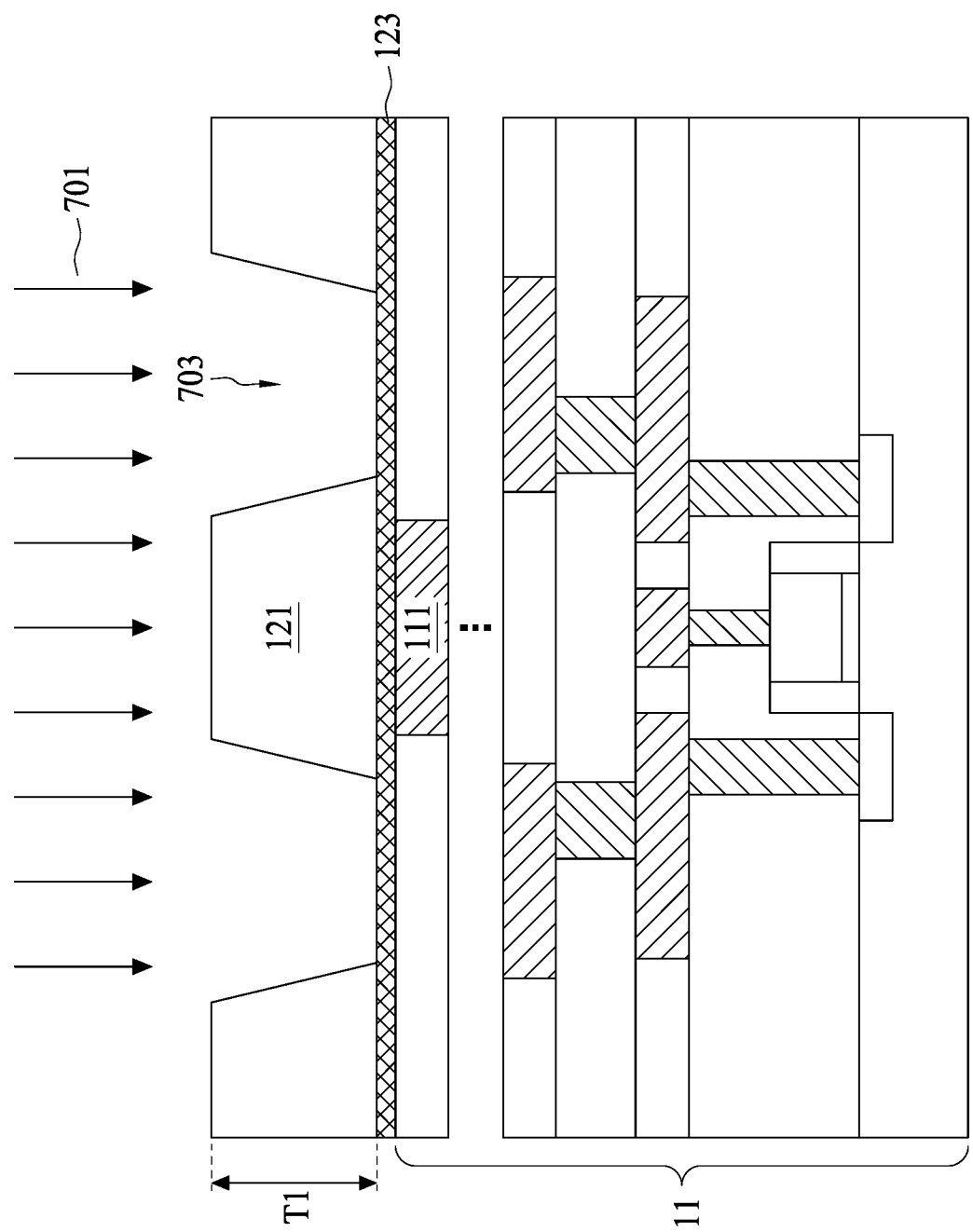
FIG. 7 to FIG. 19 show fragmental cross sectional views of the formation of a semiconductor structure having a UTM, according to some embodiments of the present disclosure.
Figure 8:
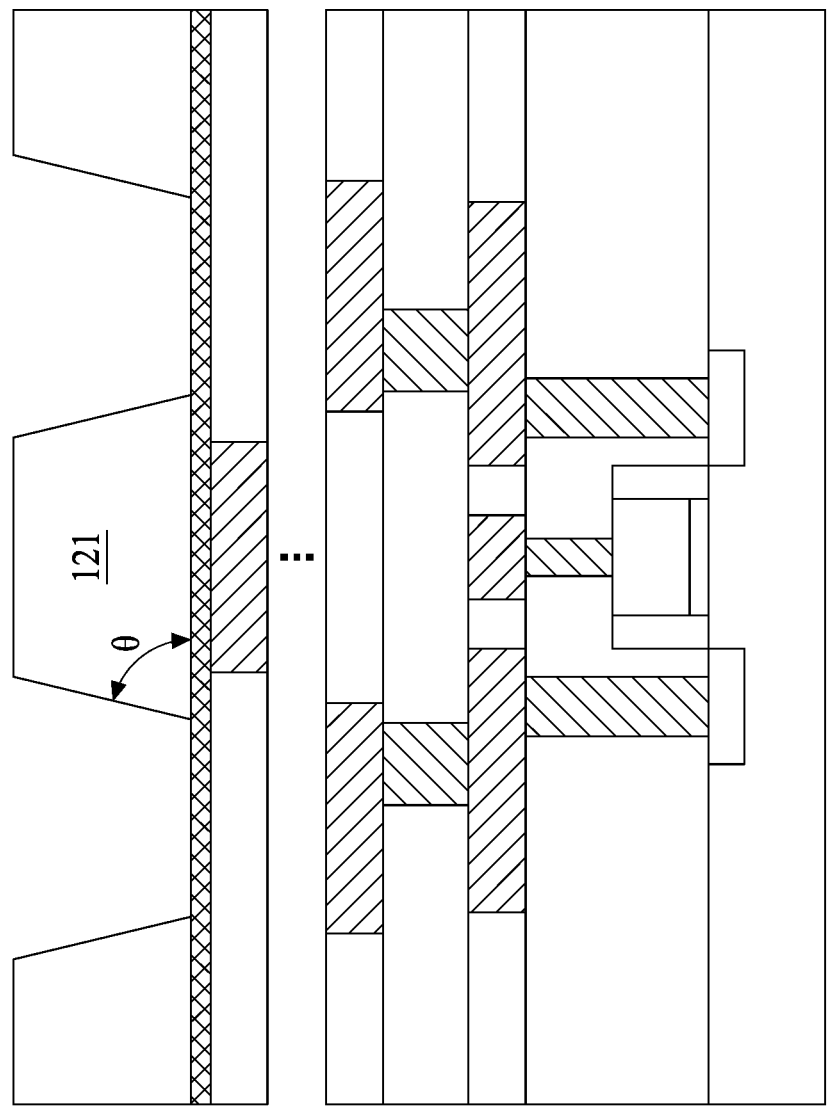

Referring to FIGS. 7-18, FIG. 7 to FIG. 18 show fragmental cross sectional views of the formation of a semiconductor structure having a UTM, according to some embodiments of the present disclosure. FIG. 7 starts with operations forming a UTM trench 703 over Mtop 111 of a transistor structure 11, as previously discussed. In some embodiments, a dielectric layer 123 is patterned to form a plurality of UTM trenches 703. For example, a layer of photo-sensitive polymer can be formed over the isolation 123, patterned with a first mask (not shown) and exposed to light 701 (often in the ultraviolet or visible region of the electromagnetic spectrum). In some embodiments, the layer of photo-sensitive polymer possesses a thickness T1 equal to or greater than 6 μm. In some embodiments, the exposed portion of the photo-sensitive polymer is hardened due to cross-link reaction and the pattern developed on the photo-sensitive polymer. In some embodiments of the present disclosure, the developed pattern is a line pattern. The photo-sensitive polymer can be different classes of photo-sensitive polymeric materials, for example, Polyimide (PI), Polybenzoxazole (PBO), Benzocyclobuten (BCB), Silicones, Acrylates, Epoxy, the like, or the combinations thereof. In FIG. 8, the UTM trench 703 developed is cured under suitable elevated temperature and for example, forms silicon oxide-based dielectric 121. Accordingly, the UTM trench 703 formed possesses a thickness T1 equal to or greater than about 6 μm.

Figure 20:
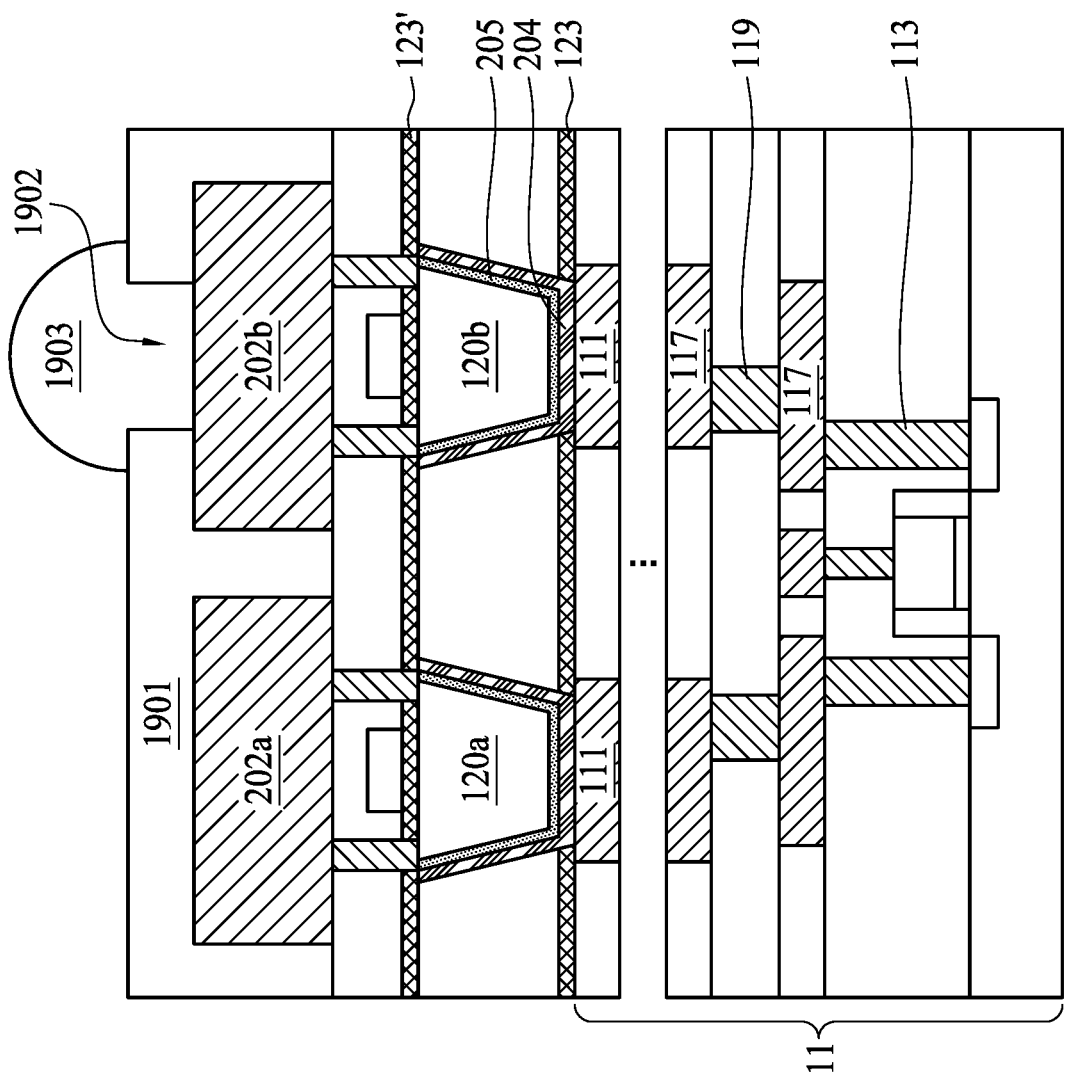
FIG. 20 is a semiconductor structure having an integrated voltage regulator, according to some embodiments of the present disclosure.

In some embodiments as shown in FIG. 20, the inductor can be devised in a form of an integrated voltage regulator. The inductor in the integrated voltage regulator is in electrical connection with the transistor structure 11 via UTM 120a, 120b. In this case, the UTM trench 703 shall be etched until the Mtop 111 is exposed. An additional lithography operation may be required to perform an etch through the isolation 123, forming openings on the isolation 123 that expose the Mtop 111.

As previously discussed, a sidewall and an extension of a shorter side of the UTM trench 703 form an acute angle θ. In some embodiments, the acute angle θ smaller than 80 degrees. In some embodiments, the acute angle θ is in a range of from about 40 degrees to about 70 degrees. Note patterning the photo-sensitive polymer does not require any photoresist materials or etching operations to form the UTM trench 703, and thus a more oblique sidewall can be formed in the UTM trench 703, benefiting subsequent deposition operations.

Figure 9:
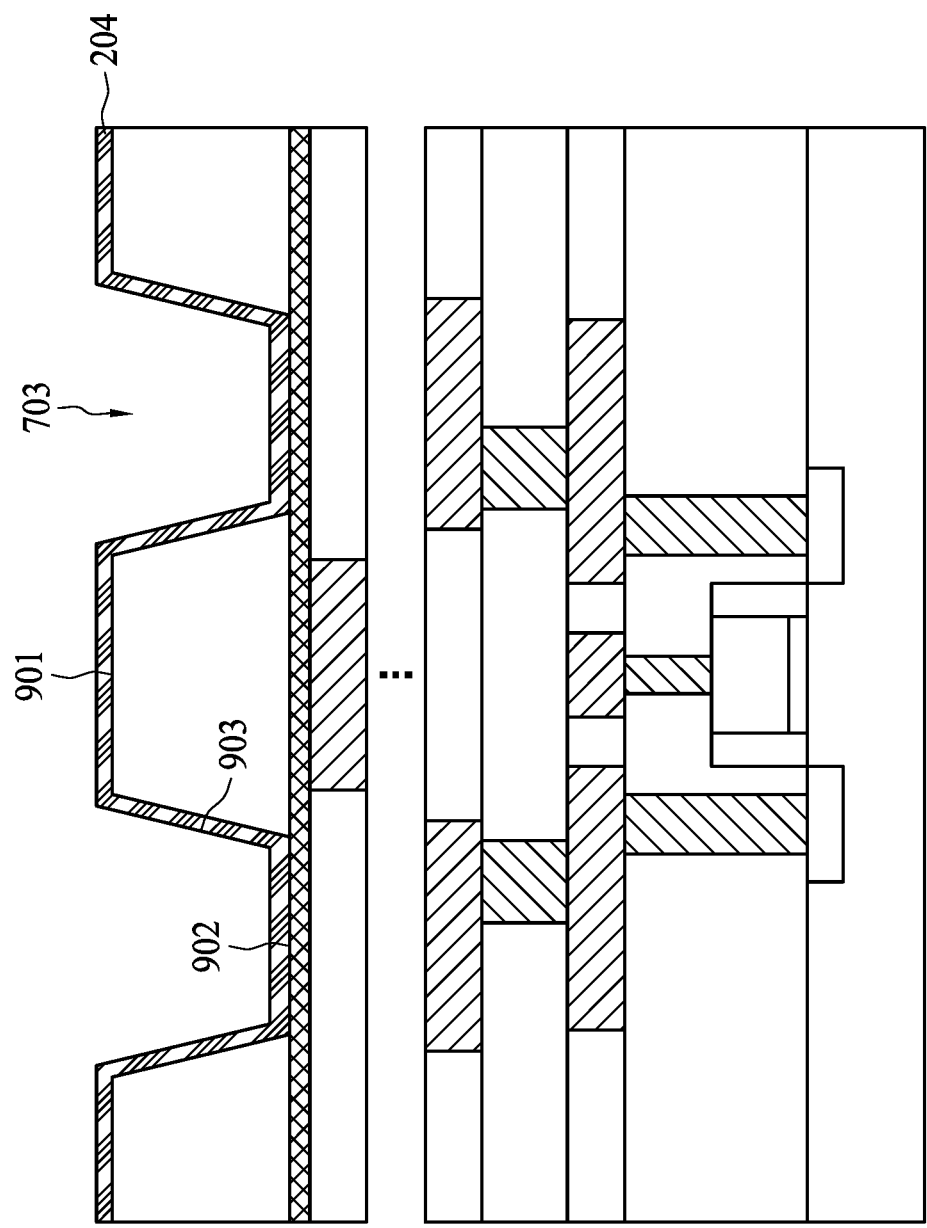
Figure 10:
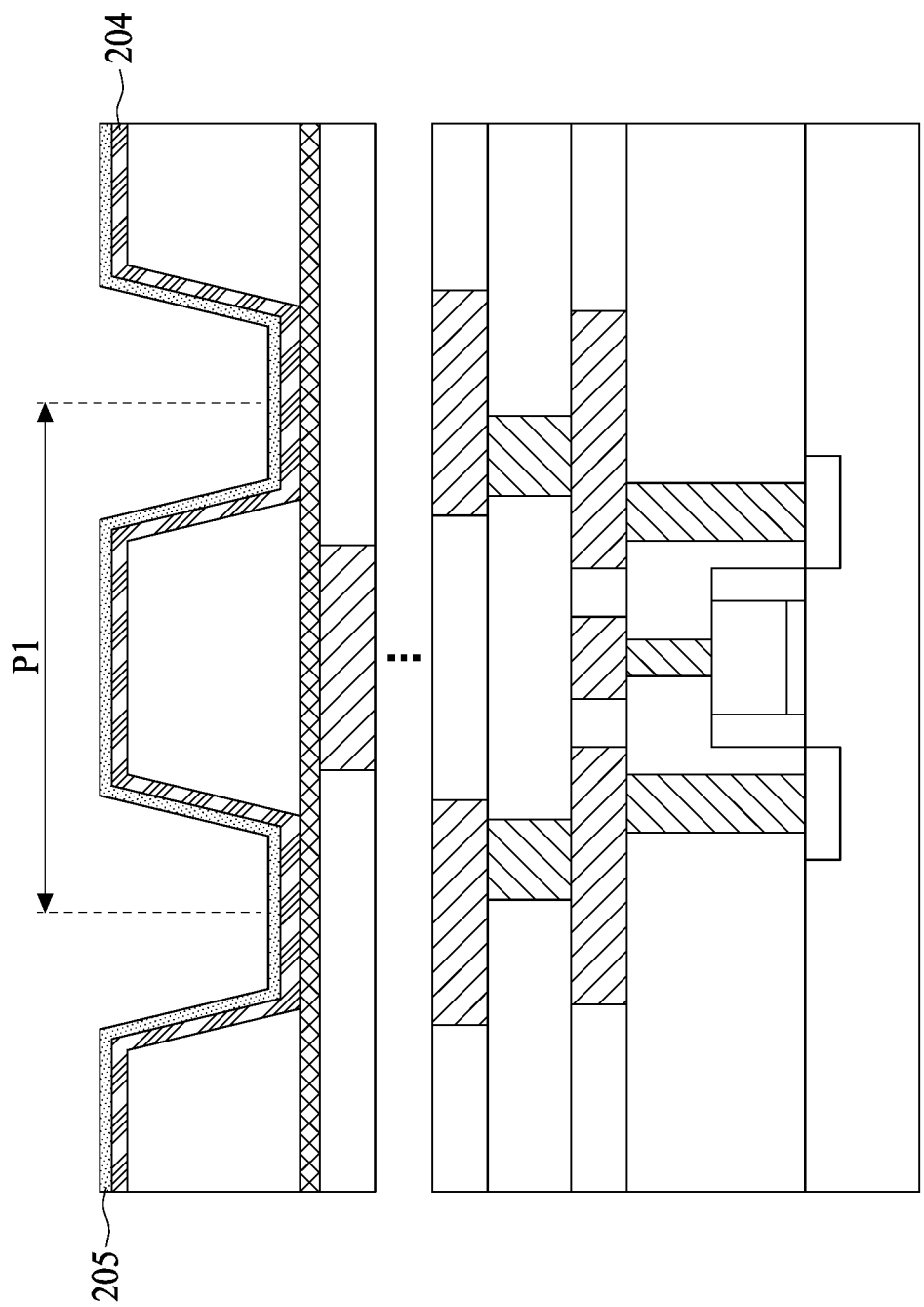

In FIG. 9, a barrier layer 204 is formed on a mesa 901, a bottom 902, and a sidewall 903 of the UTM trench 703. The barrier layer 204 is deposited by one of a CVD, PVD, ion metal plasma (IMP), or self-ionized plasma (SIP) to a thickness of from about 1 kÅ to about 3 kÅ. In some embodiments, the barrier layer 204 includes SiON. Due to an oblique sidewall of the UTM trench 703, the barrier layer 204 is deposited with greater uniformity and conformity compared to those in the conventional photoresist/etching Damascene operations. In FIG. 10, a seed layer 205 is further deposited over the barrier layer 204. The seed layer 205 is formed by atomic layer deposition (ALD), plasma enhanced ALD (PEALD), PVD, or another process to a thickness between about 0.5 kÅ and about 2 kÅ.

Figure 11:
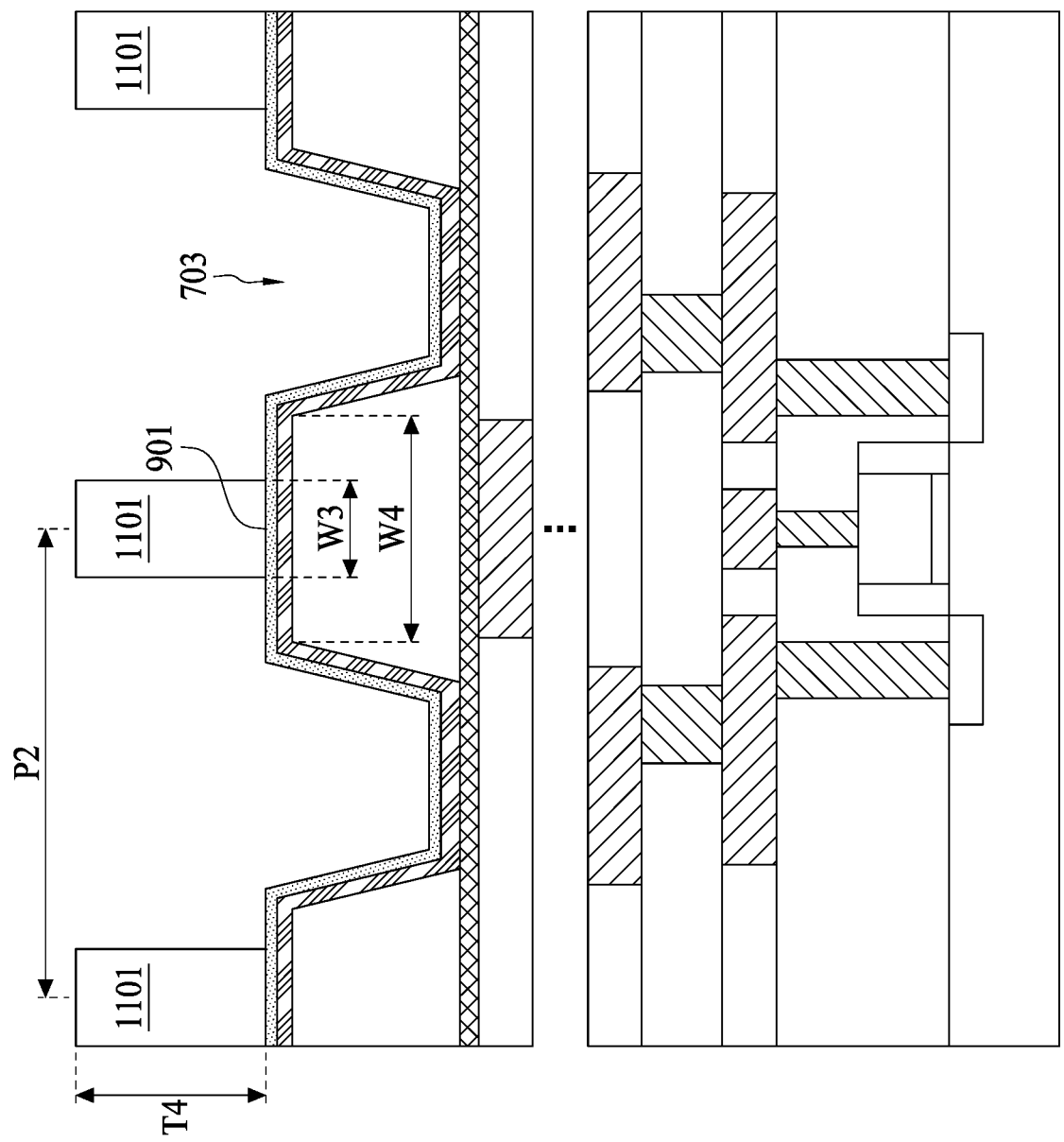

Referring to FIG. 11, a patterned photoresist (PR) 1101 is formed on the mesa 901 of the UTM trench 703. In some embodiments, a second mask (not shown) is utilized to pattern the PR 1101 in order to obtain a PR line pitch P2. In some embodiments, the PR 1101 initially formed before exposure possesses a thickens T4 of from about 12 μm to about 15 μm. The PR 1101 is exposed with electromagnetic radiation, such as ultraviolet (UV) light, through a second mask (not shown) by a photolithography process. The exposed PR 1101 is developed to form a pattern corresponding to the second mask pattern. In some embodiments the PR 1101 includes a polymeric material, such as a negative photoresist based on an acrylic polymer.

Referring to FIG. 10 and FIG. 11, the first mask patterning the UTM trench 703 possesses a line pitch P1 measured between adjacent UTM trenches 703, whereas the second mask patterning the PR 1101 possesses a line pitch P2 measured between adjacent PRs 1101. In some embodiments, the second mask can be a sizing mask of the first mask. For example, when the line pitch P1 of the first mask is about 100 μm, the line pitch P2 of the second mask can be about 2% to 20% greater than the line pitch P1, for example, 120 μm. That is, the first mask and the second mask share an identical pattern topography but the critical dimension of the line feature in the second mask is about 2% to 20% greater than the critical dimension of the line feature in the first mask. In some embodiments, a width W3 of the PR 1101 is designed to counter the possible exposure offset. For example, a width W4 of the mesa 901 is greater than the width W3 of the patterned PR 1101 by at least a predetermined value. In some embodiments, the predetermined value can be 3 μm per side of the patterned PR 1101. Various predetermined values can be designed based on the critical dimension offset nature in different manufacturing apparatus. As such, the patterned PR 1101 is ensured to be formed on the mesa 901 instead of partially or completely in the UTM trench 703.

Figure 12:
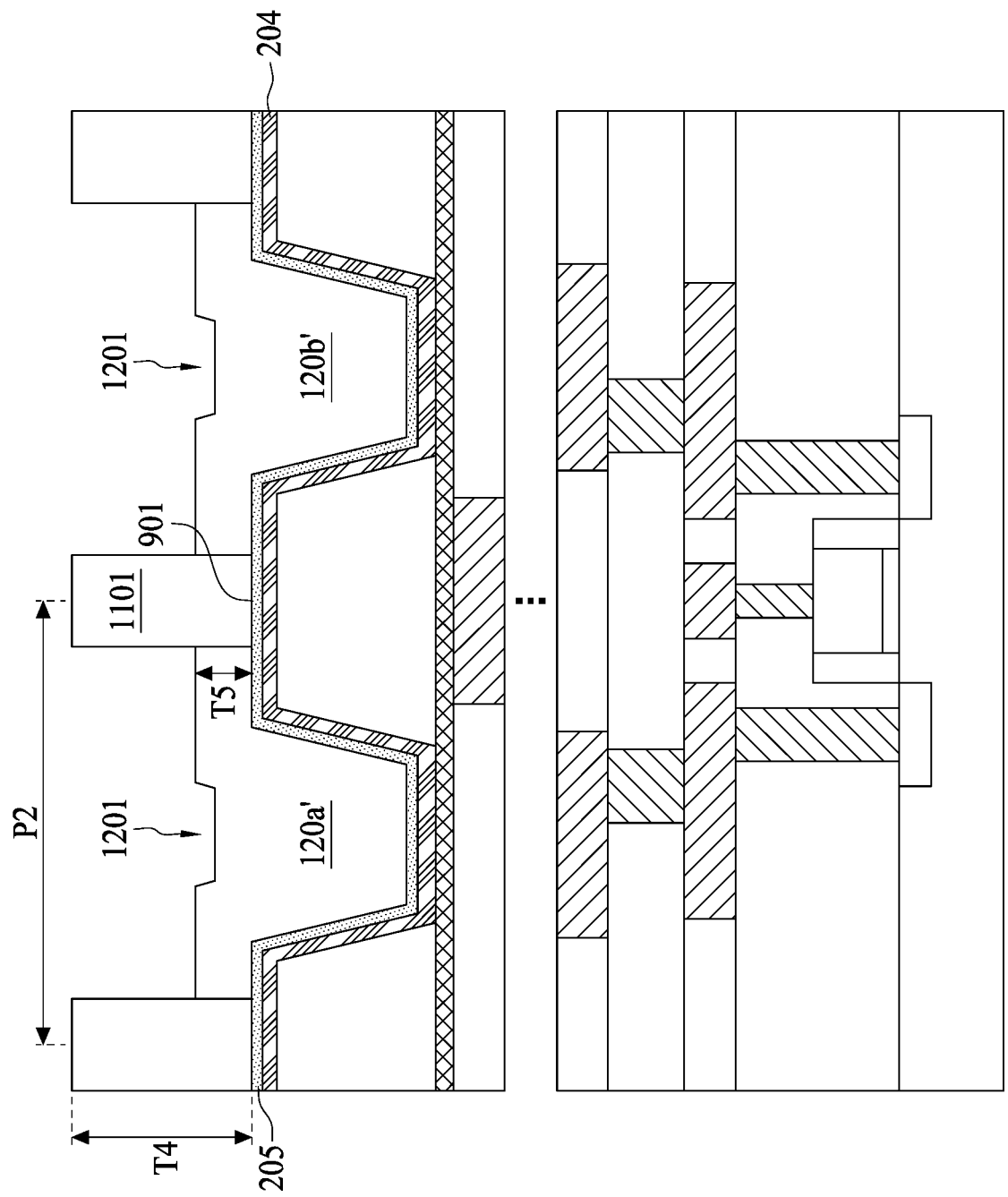

In FIG. 12, an electroplating operation is conducted to selectively plate conductive materials 120a', 120b' in the UTM trench 703. By selectively plating the conductive materials 120a', 120b' are only formed over the seed layer 205 not covered by the patterned PR 1101. Alternatively stated, the conductive materials 120a', 120b' are discrete plated lines as illustrated in the cross section of the semiconductor structure in FIG. 12. The discrete plated lines lower the effective tensile stress generated at the interface between the conductive materials and the dielectric 121 and permits a thicker conductive material to be plated in the UTM trench 703 without considerable wafer warpage. As shown in FIG. 12, a recess 1201 can be observed after the electroplating operation due to morphology of the underlying UTM trench 703 yet the overburden T5 of the as-plated conductive materials is greater than the recess 1201, such that a planarization operation can be conductive subsequently.

In some embodiments, a conventional electro-chemical plating (ECP) process is carried out to blanket deposit a copper layer filling the UTM trench 703. For example, the copper layer thickness may be equal to or greater than about 6 μm. It is understood that the dimensions recited are merely examples, and will change with the down scaling of integrated circuits. In other embodiments, the copper layer is formed by electroless plating, electroplating, chemical vapor deposition, and/or physical vapor deposition.

The electroplating operation is accomplished by applying a voltage potential between the seed layer 205 and an anode in the electroplating solution. A positive voltage is applied to the anode, with a lower voltage applied to the seed layer 205. The voltage causes the ionic copper in the electroplating solution to deposit on the seed layer 205. The electroplating voltage controls the rate at which the deposition material accumulates on the seed layer 205. A higher voltage results in a more rapid conductive materials formation. The voltage is maintained at a level sufficient to overcome the etching of the conductive materials by the acid in the electroplating solution. Thus, the voltage will cause the electroplating material to be deposited faster than it is etched away by the acid in the electroplating solution. The pH or reactivity of the electroplating solution dictates adjustments of the voltage. For example, a pH of around 6 require a lower electroplating voltage to prevent overgrowth of the conductive materials and formation of voids in the conductive materials as the corners of the UTM trench 703 later close at the top of the trench opening. In contrast, a pH of, for example 4, requires a higher voltage since the higher reactivity of the acid in the electroplating solution removes material from the conductive materials faster than a lower pH solution.

The electroplating solution may also have additional processing components. In order to provide a smoother plated surface and reduce the errors introduced in small features by plating, many electroplating solutions also include additives such as brighteners, levelers, and suppressors. Organic compounds are added to an electroplating solution and act as levelers and brighteners, increasing uniformity of metal deposition on different regions of the target surface including through holes and recesses. Additionally, salts such as chlorides, may also be included in an electroplating bath to as a brightener and to increase the deposition of plating materials Organic compound such polyethylene glycol (PEG) or, alternatively, polyalkylene glycol (PAG) function as suppressors, while organic sulfides such as Bis(3-sulfopropyl)-disodium-sulfonate ($C_6H_{12}Na_2O_6S_4$) (SPS) work as accelerators. Note the PR 1101 used herein is not soluble to the electroplating solution to an extent passing a leaching test.

Figure 13:
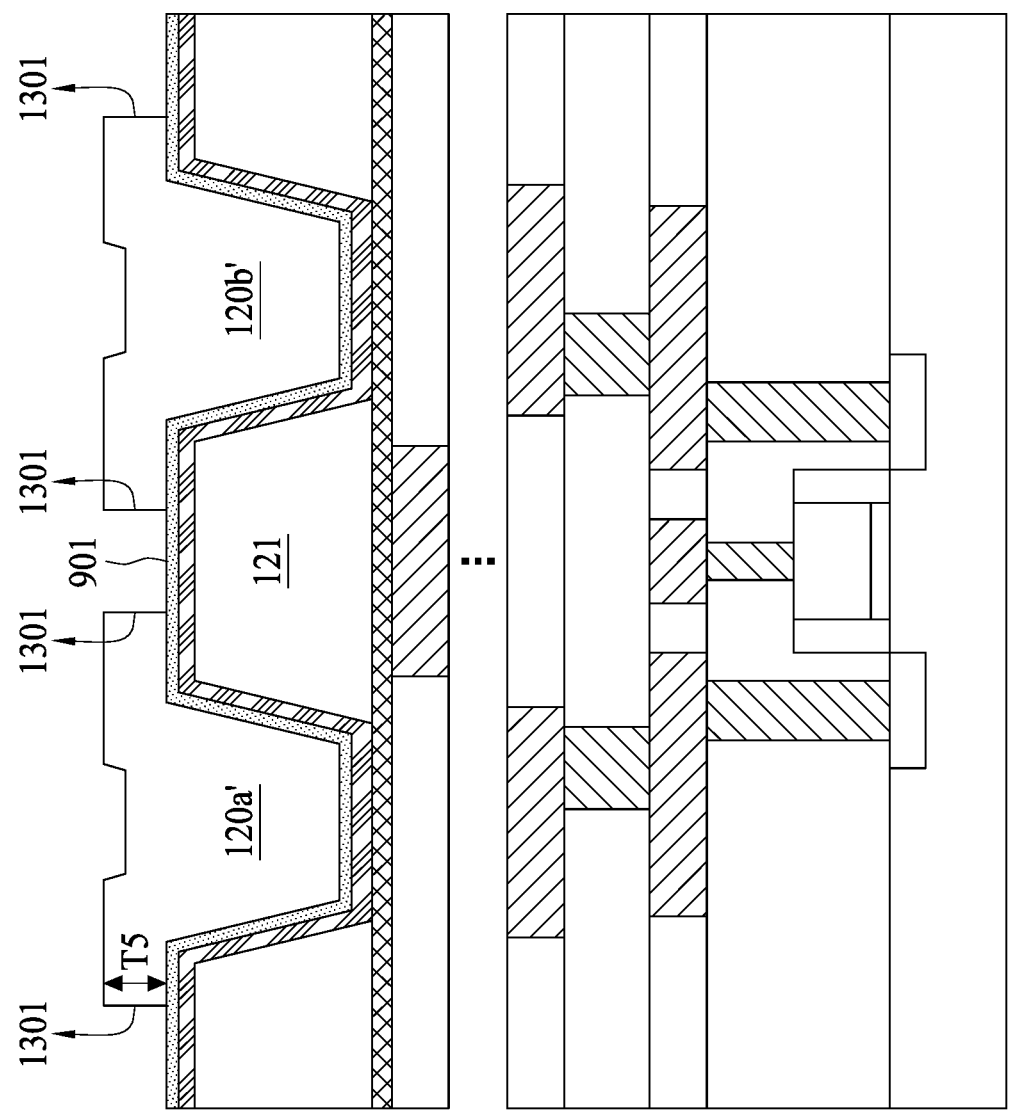

In FIG. 13, the discrete PRs 1101 are removed from the mesa 901 so as to expose a sidewall 1301 of the as-plated conductive materials. The sidewall 1301 of the conductive materials located on the mesa 901 possesses an overburden height T5 resulting from the electroplating operation. It is clear from this operation that each conductive materials 120a', 120b' are discrete conductive lines and are not connected as a blanket layer over the underlying dielectric 121.

Figure 14:
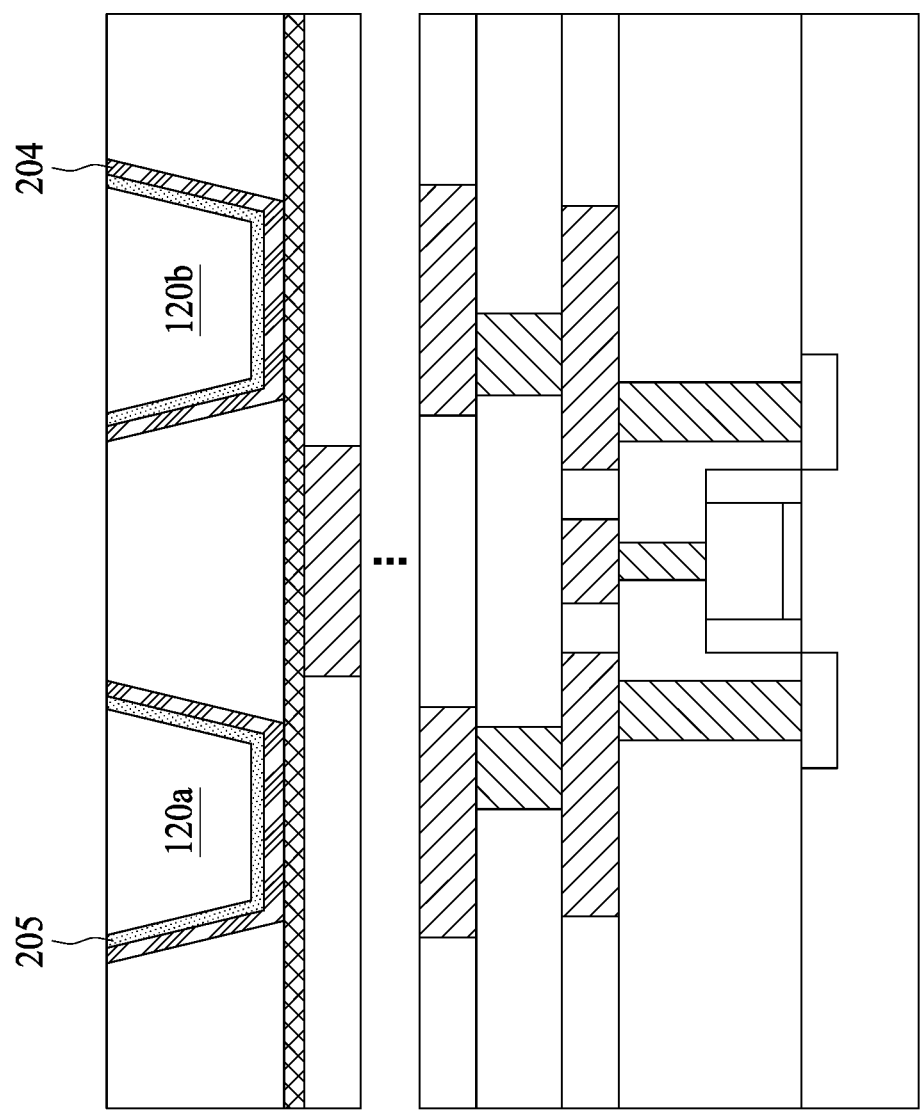

In FIG. 14, following conductive material deposition, for example copper, a conventional planarization process, for example chemical mechanical planarization (CMP), is carried out to remove excess portion of copper layer above the UTM trench 703 opening level, the seed layer 205, and the barrier layer 204. In other words, the copper layer is removed to be coplanar with the mesa 901 of the dielectric 121. In addition to CMP, other planarzing operations such as grinding, milling, polishing, etching or another technique can be used. Due to the fact that total amount of the discrete conductive material is less than that of the blanket conductive material, the CMP duration can be shortened to avoid dishing or excessive erosion of the UTM 120a, 120b.

Figure 15:
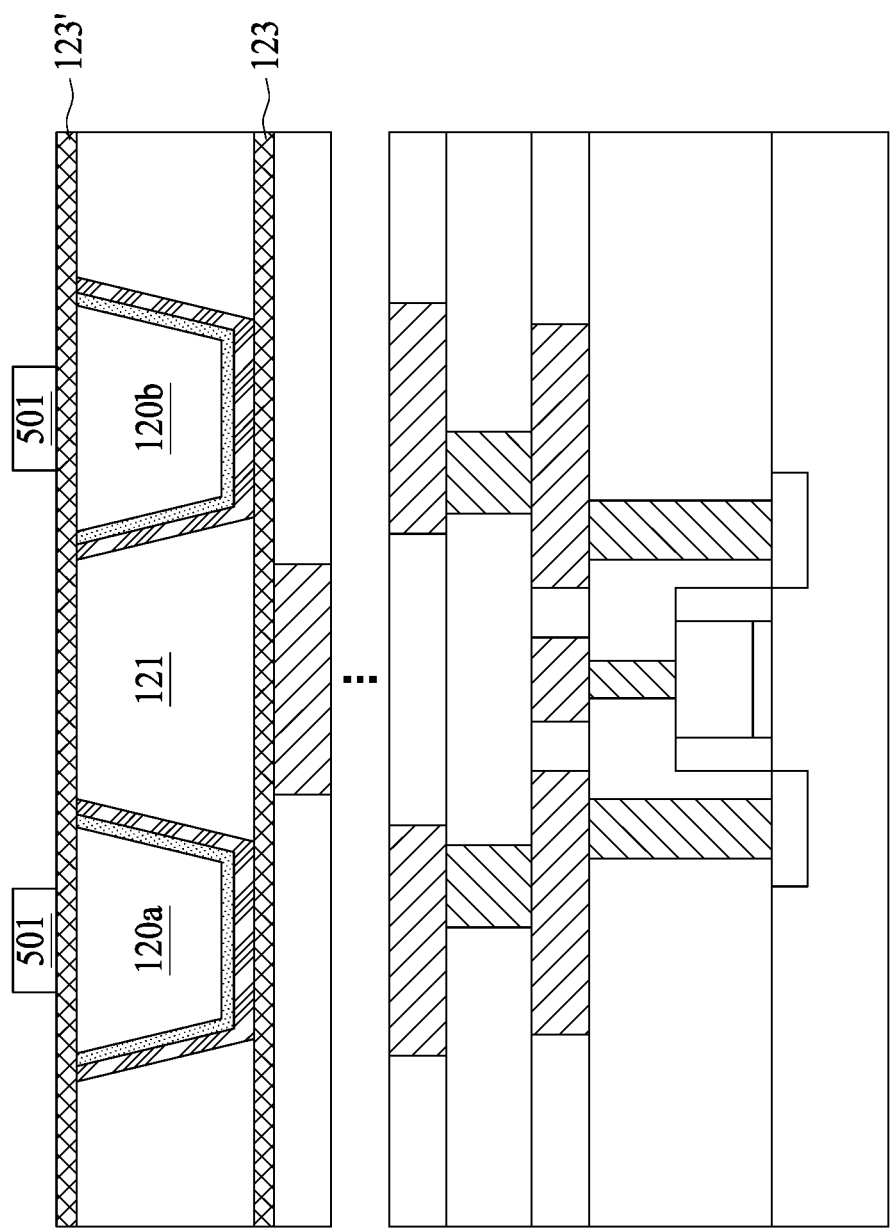
Figure 16:
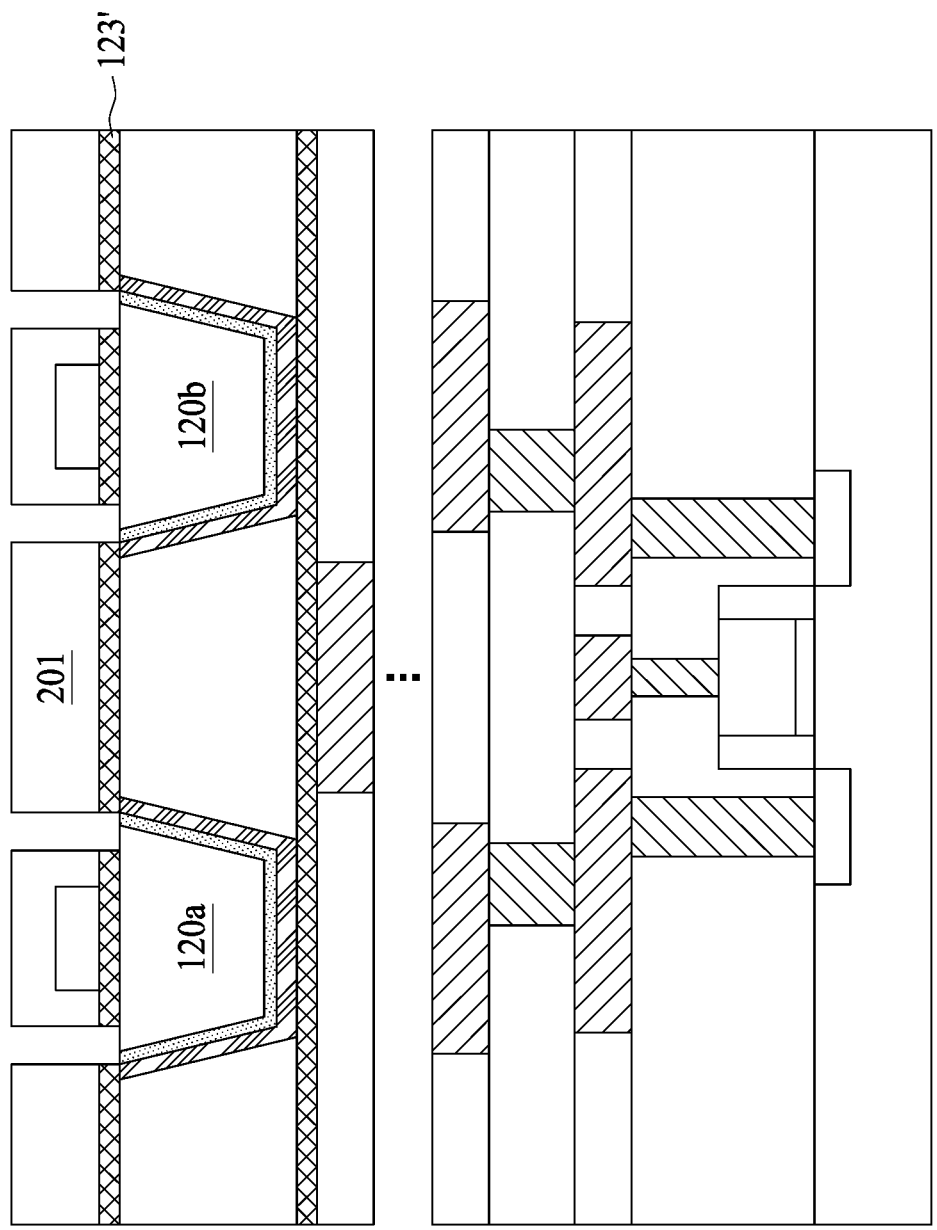
Figure 17:
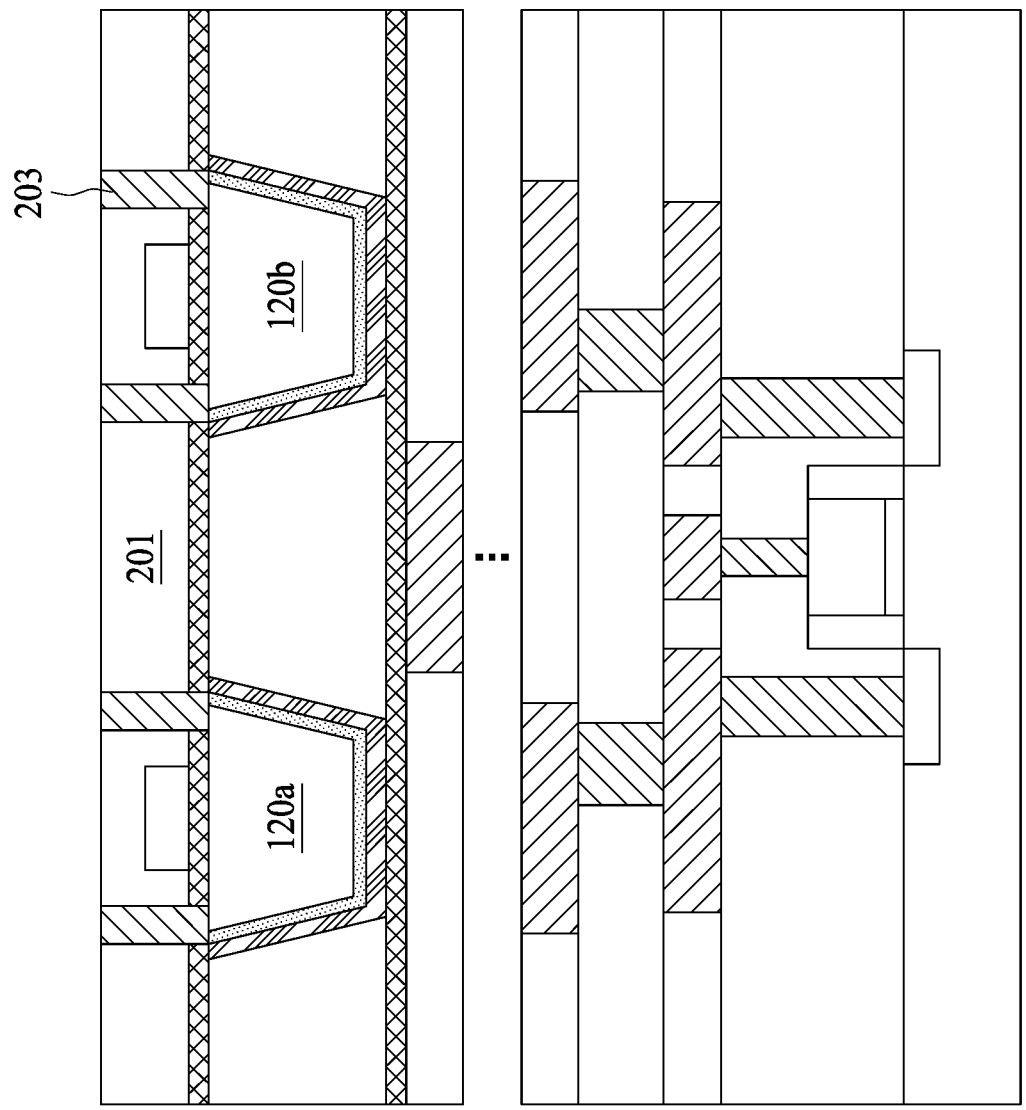

FIG. 15 shows a formation of an upper isolation 123' or the second etch stop layer over the planarized UTM 120a, 120b and the mesa of the dielectric 121. For manufacturing a semiconductor structure having an inductor, a magnetic core 501 is formed over the UTM 120a, 120b. FIG. 16 and FIG. 17 show the formation of passivation 201 surrounding the magnetic core 501 as well as the formation of via 203 penetrating through the passivation 201 and the underlying isolation 123' in order to form electrical contact with the UTM 120a, 120b. In some embodiments, an etching operation (such as a dry etch, a wet etch, or a plasma etch) is performed to form an opening in the passivation 201 using the isolation 123' to stop etching to the UTM 120a, 120b for this operation. A portion of the isolation 123' is then subsequently removed to form the opening for via 203. In some embodiments, the etching is performed by using source gases $CH_2F_2$ and/or $CHF_3$ together with Nitrogen, Argon, and/or Helium. In another embodiment, an etching chemical, such as $C_4F_6$ and/or $C_4F_8$, together with $CF_4$ plasma source gases are used for performing the etching.

Figure 18:
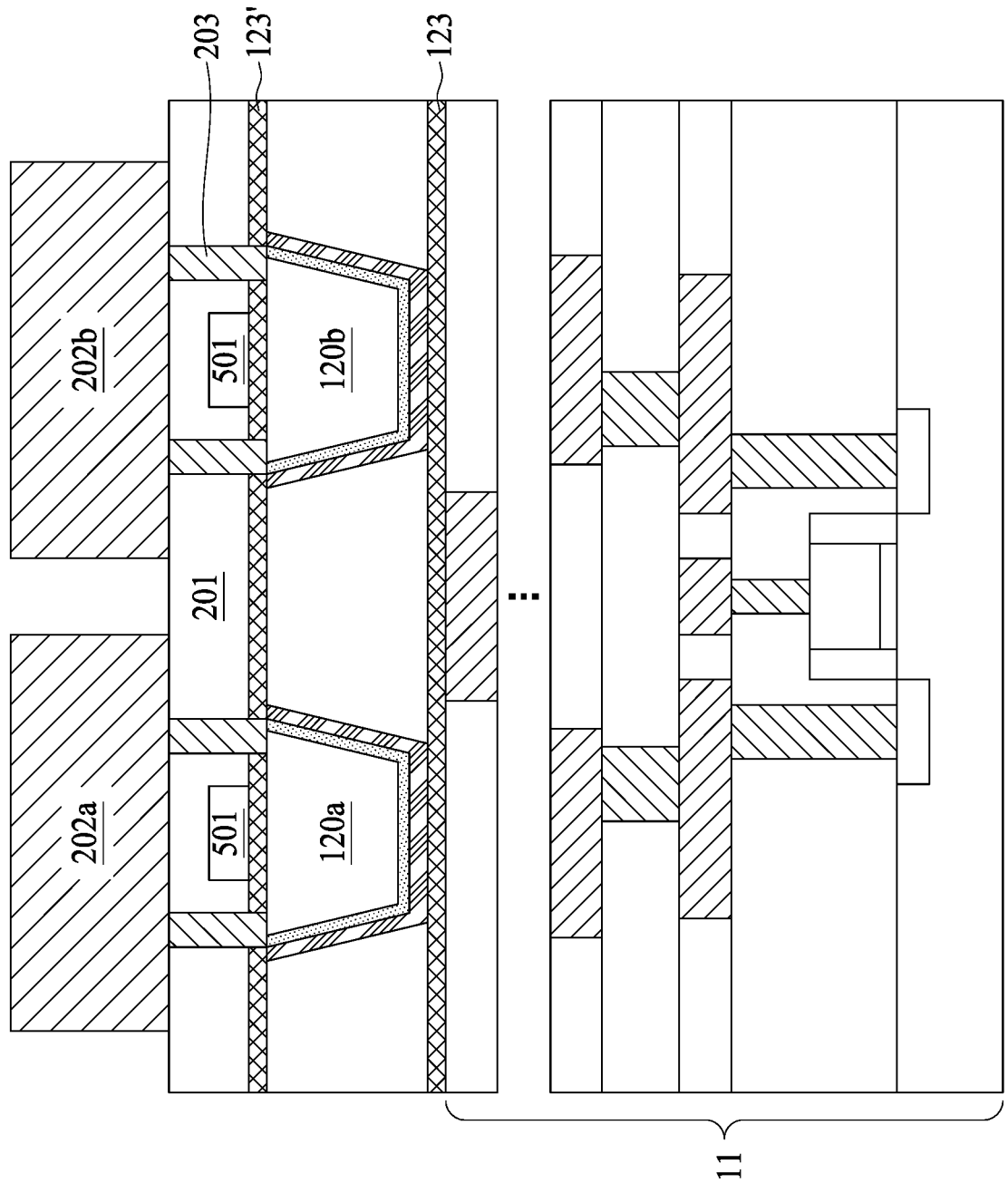

In FIG. 18, patterned PPI 202a, 202b are deposited over the passivation 201, electrically connecting to the via 203 thereby forming a conductive loop including the PPI 202a, 202b, the vias 203, and the UTM 120a, 120b. The conductive loop spiraling down the magnetic core 501 to complete an inductor over the Mtop 111 of a transistor structure 11. In FIG. 19, a passivation 1901 is formed covering the patterned PPI 202a, 202b. An opening 1902 receiving conductive terminals such as solder balls 1903 can be formed over the PPI 202b in order to make external connection to a voltage source. In some embodiments, the inductor integrated in the semiconductor structure of FIG. 19 is a discrete inductor. The discrete inductor is not connected to the underlying transistor structure 11 through UTM 120a, 120b, but rather through external connections. As shown in FIG. 19, the UTM 120a, 120b is isolated from the Mtop 111 of the transistor structure by the isolation 123. External connections can be in a form of a wire bond (not shown in FIG. 19) connecting one end of the discrete inductor to a voltage source (not shown in FIG. 19) and the other end to the underlying transistor structure 11.

According to some embodiments, the semiconductor shown in FIG. 20 can be an integrated voltage regulator in a sense that the inductor is electrically coupled to the Mtop 111 through UTM 120a, 120b, and thus coupling to the underlying transistor structure 11. In FIG. 20, the isolation 123 possesses several openings so that the barrier layer 204 of the UTM 120a, 120b is in contact with the Mtop 111 of the transistor structure 11. In this connection, an external connection can be formed connecting one end of the inductor to a voltage source through the solder ball 1903 over the PPI 202b.

The integrated circuit device may undergo further CMOS or MOS technology processing to form various features known in the art. For example, one or more contact features (not shown), such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

The present disclosure provides a semiconductor structure having an ultra thick metal (UTM). The semiconductor structure includes a substrate, a top metal of a transistor structure over the substrate, and an UTM over the top metal. An area density of the UTM is greater than 40% and a thickness of the UTM is equal to or greater than 6 micrometer.

The present disclosure provides a semiconductor structure having an inductor. The semiconductor structure includes a substrate, a top metal of a transistor structure over the substrate, and an inductor over the top metal. The inductor includes a bottom metal and a top metal electrically connecting to the bottom metal through a via. A thickness of the bottom metal is equal to or greater than 6 µm.

The present disclosure provides a method for manufacturing a semiconductor structure having a UTM. The method includes patterning a dielectric layer with a plurality of trenches by a first mask, patterning a photoresist positioning on a mesa between adjacent trenches by a second mask, and selectively plating conductive materials in the plurality of trenches.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a logic substrate, comprising:
      a semiconductor device; and
      an interconnection structure over the semiconductor device, the interconnection structure having a metal layer surrounded by a dielectric layer;
   an ultra thick metal (UTM) over the metal layer, the UTM comprising a top surface; and
   a photo-sensitive polymer layer surrounding the UTM, the top surface of the UTM being coplanar with a top surface of the photo-sensitive polymer layer, and the photo-sensitive polymer layer being different from the dielectric layer.

2. The semiconductor structure of claim 1, wherein UTM is positioned in a trapezoidal trench.

3. The semiconductor structure of claim 2, wherein the UTM has a shorter side in proximity to the metal layer, an acute angle between a sidewall and an extension of the shorter side of the trapezoidal trench is in a range of from about 40 degrees to about 70 degrees.

4. The semiconductor structure of claim 1, further comprising an isolation layer between the metal layer and the UTM.

5. The semiconductor structure of claim 4, further comprising a via in a passivation layer above the UTM, electrically connecting the UTM and a post passivation interconnect (PPI) over the UTM.

6. The semiconductor structure of claim 5, wherein the PPI comprises a vertical sidewall.

7. The semiconductor structure of claim 1, wherein a critical dimension of a line pitch of the UTM is in a range of from about 20 µm to about 375 µm.

8. The semiconductor structure of claim 1, further comprising a barrier layer between the UTM and the photo-sensitive polymer layer surrounding the UTM.

9. A semiconductor structure, comprising:
   a logic substrate, comprising:
      a semiconductor device; and
      an interconnection structure over the semiconductor device, the interconnection structure having a metal layer surrounded by a dielectric layer;
   an inductor over the metal layer, comprising:
      a lower metal having a top surface;
      a photo-sensitive polymer layer surrounding the lower metal, the top surface of the lower metal being coplanar with a top surface of the photo-sensitive polymer layer, and the photo-sensitive polymer layer being different from the dielectric layer; and
      an upper metal electrically connecting to the lower metal through a via.

10. The semiconductor structure of claim 9, further comprising a magnetic core between the upper metal and the lower metal.

11. The semiconductor structure of claim 9, wherein the upper metal is a post passivation interconnect (PPI) having a thickness equal to or greater than about 10 µm.

12. The semiconductor structure of claim 9, wherein the lower metal comprises a line pattern, a cross section of the line pattern comprising an upper surface in proximity to the via and a lower surface opposite to the upper surface, a length of the upper surface being greater than a length of the lower surface.

13. The semiconductor structure of claim 12, wherein a ratio of one half of a length difference between the upper surface and the lower surface and the thickness of the lower metal is in a range of from about 0.8 to about 2.8.

14. The semiconductor structure of claim 10, wherein the via and the magnetic core are in a passivation layer between the lower metal and the upper metal.

15. The semiconductor structure of claim 9, wherein the lower metal is an ultra thick metal (UTM) with a thickness equal to or greater than 6 µm.

16. A semiconductor structure, comprising:
a logic substrate, comprising:
   a semiconductor device; and
   an interconnection structure over the semiconductor device, the interconnection structure having a metal layer surrounded by a dielectric layer;
an ultra thick metal (UTM) over the metal layer;
a photo-sensitive polymer layer surrounding the UTM, and the photo-sensitive polymer layer being different from the dielectric layer; and
a seed layer between a sidewall of the UTM and the photo-sensitive polymer layer.

17. The semiconductor structure of claim 16, where in a top surface of the UTM is coplanar with a top surface of the photo-sensitive polymer layer.

18. The semiconductor structure of claim 16, wherein the seed layer is further between a bottom surface of the UTM and an isolation layer over the metal layer.

19. The semiconductor structure of claim 16, further comprising a post passivation interconnect (PPI) over the UTM layer and electrically connected thereto through a via in a passivation layer.

20. The semiconductor structure of claim 16, wherein a bottom surface of the UTM is narrower than a top surface of the UTM, an acute angle between the sidewall and an extension of the bottom surface is in a range of from about 40 degrees to about 70 degrees.

\* \* \* \* \*